US011158583B2

(12) United States Patent
Aoki

(10) Patent No.: US 11,158,583 B2
(45) Date of Patent: Oct. 26, 2021

(54) SUBSTRATE WITH BUILT-IN COMPONENT

(71) Applicant: SHINKO ELECTRIC INDUSTRIES CO., LTD., Nagano (JP)

(72) Inventor: Nobutaka Aoki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 16 days.

(21) Appl. No.: 16/854,112

(22) Filed: Apr. 21, 2020

(65) Prior Publication Data
US 2020/0343192 A1    Oct. 29, 2020

(30) Foreign Application Priority Data

Apr. 26, 2019 (JP) ............................ JP2019-085376

(51) Int. Cl.
*H01L 23/495* (2006.01)
*H01L 23/538* (2006.01)
*H01L 23/13* (2006.01)
*H01L 23/498* (2006.01)
*H01L 23/00* (2006.01)
*H01L 21/48* (2006.01)

(52) U.S. Cl.
CPC ...... *H01L 23/5389* (2013.01); *H01L 21/4853* (2013.01); *H01L 21/4857* (2013.01); *H01L 23/13* (2013.01); *H01L 23/49816* (2013.01); *H01L 23/5383* (2013.01); *H01L 23/5386* (2013.01); *H01L 24/16* (2013.01); *H01L 24/32* (2013.01); *H01L 24/73* (2013.01); *H01L 2224/16238* (2013.01); *H01L 2224/32225* (2013.01); *H01L 2224/73204* (2013.01)

(58) Field of Classification Search
CPC . H01L 21/4853; H01L 21/4857; H01L 23/13; H01L 23/5383; H01L 23/49816; H01L 23/5386; H01L 23/5389; H01L 24/16; H01L 24/32; H01L 24/73
USPC ........................................................ 257/668
See application file for complete search history.

(56) References Cited

U.S. PATENT DOCUMENTS

| | | | | |
|---|---|---|---|---|
| 8,704,263 | B2 * | 4/2014 | Son ....................... | H01L 33/486 257/99 |
| 9,601,461 | B2 * | 3/2017 | Ho ....................... | H01L 23/5383 |
| 9,875,911 | B2 * | 1/2018 | Pagaila ................... | H01L 23/13 |
| 10,211,149 | B2 * | 2/2019 | Harr ....................... | H01L 23/562 |

FOREIGN PATENT DOCUMENTS

JP          2016-096281          5/2016

* cited by examiner

*Primary Examiner* — Luan C Thai
(74) *Attorney, Agent, or Firm* — IPUSA, PLLC

(57) ABSTRACT

A substrate with built-in component includes: a first wiring layer having at least one reference pattern; a first insulating layer formed on the first wiring layer; and an electronic component mounted, in a cavity formed in the first insulating layer, on the first wiring layer, wherein the at least one reference pattern includes at least one first portion crossing a side surface of the electronic component in plan view, and at least one second portion crossing a side surface of the cavity in plan view.

6 Claims, 30 Drawing Sheets

SUBSTRATE WITH BUILT-IN COMPONENT

CROSS-REFERENCE TO RELATED APPLICATION

This application is based upon and claims priority to Japanese Patent Application No. 2019-085376, filed on Apr. 26, 2019, the entire contents of which are incorporated herein by reference.

FIELD

The present disclosure relates to a substrate with built-in component.

BACKGROUND

In a process of manufacturing a substrate with built-in component, a cavity is formed by laser processing and an electronic component is mounted in the cavity (Patent Document 1).

Generally, a wiring pattern of a wiring layer included in a substrate with built-in component is formed by photolithography using a photomask or the like by an exposure device. On the other hand, a cavity is formed by irradiating an insulating layer with laser light using a laser processor. Laser processing accuracy by a laser processor is lower than that of photolithography. Thus, although the wiring pattern can be formed with high accuracy, the positional accuracy of the cavity is lower than the positional accuracy of the wiring pattern. Also, misalignment of an electronic component within the cavity may occur. Therefore, after the electronic component is mounted, the distance between an alignment mark formed in the wiring layer and an alignment mark formed in the electronic component is measured, and the position accuracy is checked.

RELATED-ART DOCUMENTS

Patent Documents

[Patent Document 1] Japanese Laid-open Patent Publication No. 2016-96281

The present disclosure has an object to provide a substrate with built-in component that enables to easily check positional accuracy between a cavity and an electronic component.

SUMMARY

According to one aspect of the present disclosure, a substrate with built-in component includes: a first wiring layer having at least one reference pattern; a first insulating layer formed on the first wiring layer; and an electronic component mounted, in a cavity formed in the first insulating layer, on the first wiring layer; wherein the at least one reference pattern includes at least one first portion crossing a side surface of the electronic component in plan view, and at least one second portion crossing a side surface of the cavity in plan view.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
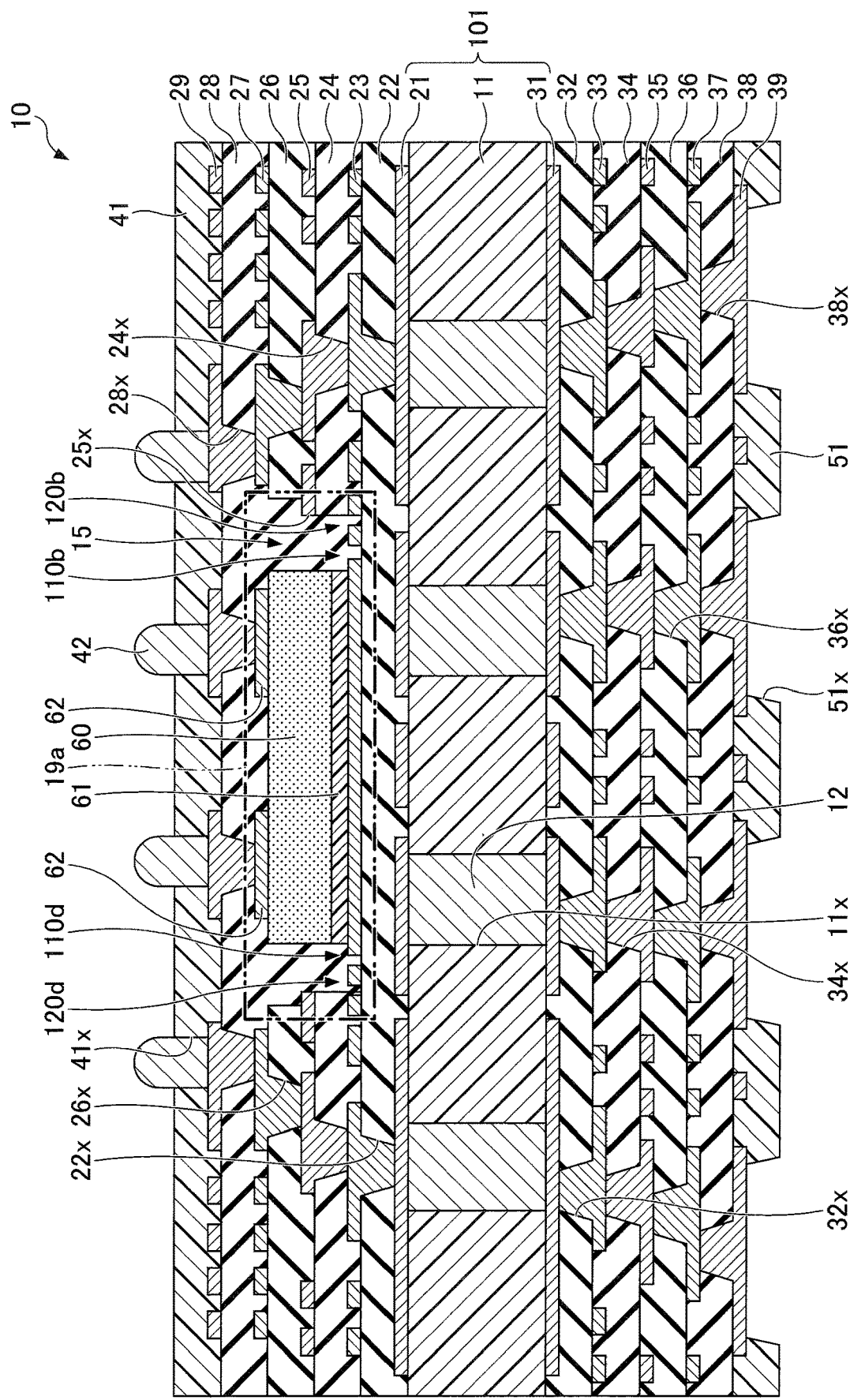
FIG. 1 is a cross-sectional view illustrating a structure of a substrate with built-in component according to a first embodiment.

In the following, the embodiments will be described with reference to the accompanying drawings. Note that in the specification and the drawings, substantially same constituent elements may be referred to by the same reference numerals, and duplicate descriptions may be omitted as appropriate.

First Embodiment

A first embodiment will be described. The first embodiment relates to a substrate with built-in component 10.

[Structure of Substrate with Built-in Component]

Figure 2:
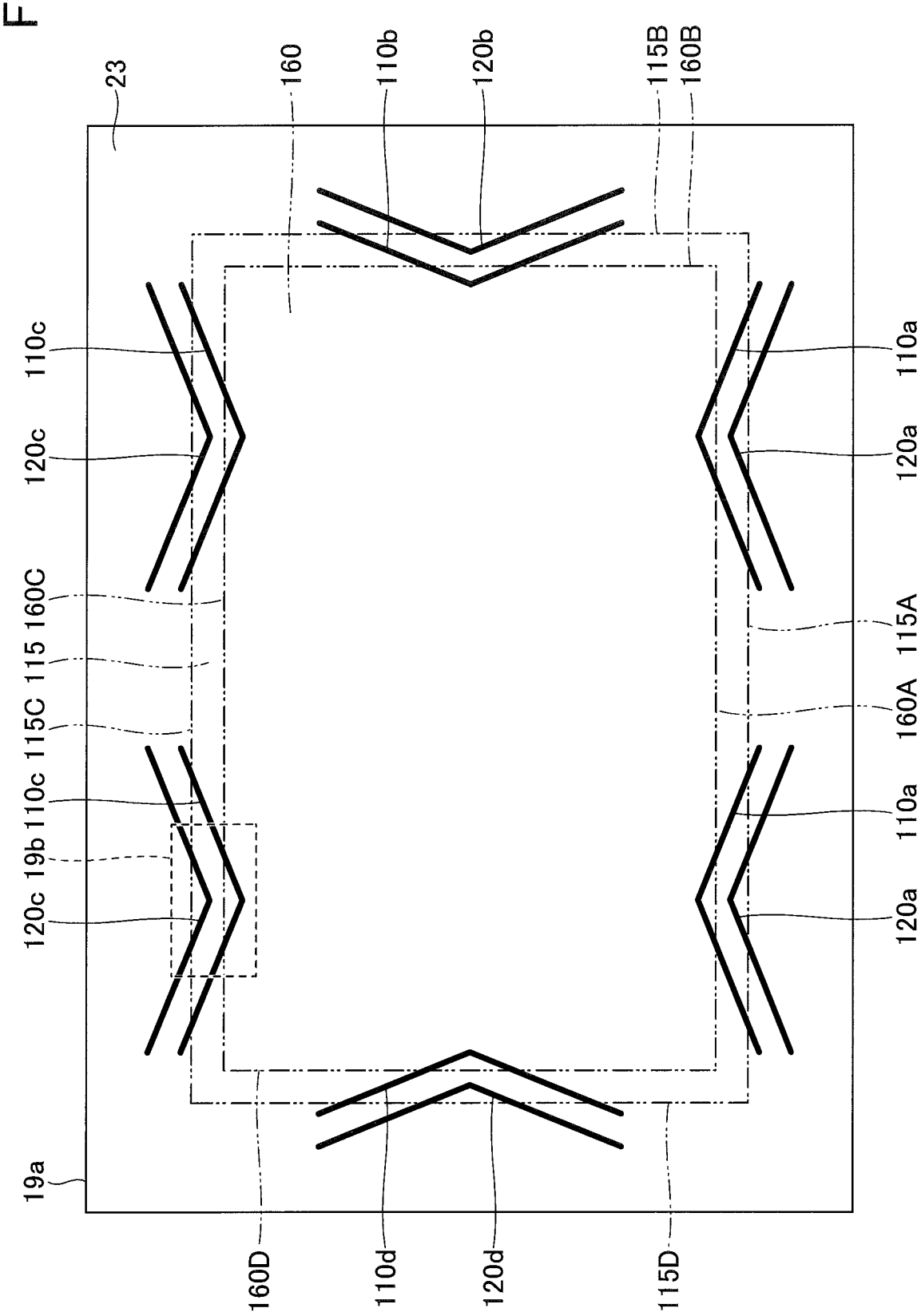
FIG. 2 is a diagram illustrating a configuration of a wiring layer where reference patterns are formed.

First, a structure of the substrate with built-in component 10 will be described. FIG. 1 is a cross-sectional view illustrating the structure of the substrate with built-in component 10 according to the first embodiment. FIG. 2 is a diagram illustrating a configuration of a wiring layer where reference patterns are formed. FIG. 2 illustrates a configuration within an area 19a surrounded by a double-dot chain line in FIG. 1.

As illustrated in FIG. 1, the substrate with built-in component 10 according to the first embodiment includes a core wiring substrate 101 including a core layer 11, through wirings 12, a wiring layer 21, and a wiring layer 31. The substrate with built-in component 10 further includes an insulating layer 22, a wiring layer 23, an insulating layer 24, a wiring layer 25, an insulating layer 26, a wiring layer 27, an insulating layer 28, a wiring layer 29, a solder resist layer 41, and external connection terminals 42. The substrate with built-in component 10 further includes an insulating layer 32, a wiring layer 33, an insulating layer 34, a wiring layer 35, an insulating layer 36, a wiring layer 37, an insulating layer 38, a wiring layer 39, and a solder resist layer 51. The substrate with built-in component 10 further includes an electronic component 60.

Note that, with respect to the substrate with built-in component 10, for convenience of description, the solder resist layer 41 side is referred to as one side (or one surface), and the solder resist layer 51 side is referred to as the other side (or the other surface). Also, in the present disclosure, a plan view refers to a view of an object viewed from the one side, and a planar shape refers to the shape of an object viewed from the one side. Note that the substrate with built-in component 10, however, can be used in an inverted position or can be oriented at a desired angle.

As illustrated in FIG. 1, in the substrate with built-in component 10, the wiring layer 21 is formed on the one surface of the core layer 11, and the wiring layer 31 is formed on the other surface. The wiring layer 21 and the wiring layer 31 are electrically connected by through wirings 12 formed in through holes 11x that passes from one surface of the core layer 11 to the other surface of the core layer 11.

The wiring layers 21 and 31 are patterned into respective predetermined planar shapes.

For example, as the core layer 11, a glass epoxy substrate obtained by impregnating a glass cloth with an epoxy-based resin or the like can be used. As the core layer 11, a substrate obtained by impregnating a woven fabric such as a glass fiber, a carbon fiber, or an aramid fiber or a non-woven fabric with an insulating resin such as an epoxy-based resin or a polyimide-based resin or the like may also be used. The thickness of the core layer 11 can be approximately 100 μm to 200 μm, for example. The core layer 11 is provided with the through holes 11x that penetrate the core layer 11 in the thickness direction. Note that, in each drawing, the illustration of glass cloth or the like is omitted. For example, copper (Cu) or the like can be used as the material of the through wirings 12, the wiring layer 21, and the wiring layer 31.

As illustrated in FIG. 1, the insulating layer 22 is formed on the one surface of the core layer 11 so as to cover the wiring layer 21. As a material of the insulating layer 22, for example, an insulating resin whose main component is an epoxy-based resin or a polyimide-based resin or the like can be used. Also, the insulating layer 22 may include a filler such as silica ($SiO_2$). The thickness of the insulating layer 22 can be, for example, approximately 30 μm to 70 μm.

The wiring layer 23 is formed on the one side of the insulating layer 22. The wiring layer 23 is configured to include via wirings filling via holes 22x that penetrate the insulating layer 22 and expose the one surface of the wiring layer 21 and include a wiring pattern formed on the one surface of the insulating layer 22. Each of the via holes 22x is a recessed portion having a truncated cone shape in which the area of the opening portion opened on the insulating layer 24 side is larger than the area of the bottom surface of the opening portion formed by the one surface of the wiring layer 21. As a material of the wiring layer 23, for example, copper (Cu) or the like can be used. The thickness of the wiring layer 23 can be, for example, approximately 10 μm to 30 μm. Although described in detail below, as illustrated in FIG. 2, the wiring layer 23 includes reference patterns 110a, 110b, 110c, 110d, 120a, 120b, 120c, and 120d. The wiring layer 23 is an example of a first wiring layer.

The insulating layer 24 is formed on the one surface of the insulating layer 22 so as to cover the wiring layer 23. The material and the thickness of the insulating layer 24 can be, for example, similar to those of the insulating layer 22. Also, the insulating layer 24 may include a filler such as silica ($SiO_2$). The insulating layer 24 is an example of a first insulating layer.

The wiring layer 25 is formed on the one side of the insulating layer 24. The wiring layer 25 is configured to include via wirings filling via holes 24x that penetrate the insulating layer 24 and expose the one surface of the wiring layer 23 and include a wiring pattern formed on the one surface of the insulating layer 24. Each of the via holes 24x is a recessed portion having a truncated cone shape in which the area of the opening portion opened on the insulating layer 26 side is larger than the area of the bottom surface of the opening portion formed by the one surface of the wiring layer 23. The material and the thickness of the wiring layer 25 can be similar to those of the wiring layer 23, for example. Although details will be described later, the wiring layer 25 has, in an area where the electronic component 60 is mounted, an opening pattern 25x penetrating the wiring layer 25. The wiring layer 25 is an example of a second wiring layer.

The insulating layer 26 is formed on the one surface of the insulating layer 24 so as to cover the wiring layer 25. The material and the thickness of the insulating layer 26 can be, for example, similar to those of the insulating layer 22. Also, the insulating layer 26 may include a filler such as silica ($SiO_2$). The insulating layer 26 is an example of a second insulating layer.

The wiring layer 27 is formed on the one side of the insulating layer 26. The wiring layer 27 is configured to include via wirings filling via holes 26x that penetrate the insulating layer 26 and expose the one surface of the wiring layer 25 and include a wiring pattern formed on the one surface of the insulating layer 26. Each of the via holes 26x is a recessed portion having a truncated cone shape in which the area of the opening portion opened on the insulating layer 28 side is larger than the area of the bottom surface of the opening portion formed by the one surface of the wiring layer 25. The material and the thickness of the wiring layer 27 can be similar to those of the wiring layer 23, for example.

In the insulating layer 26, the wiring layer 25, and the insulating layer 24, a cavity 15 is formed to penetrate the insulating layer 26, the wiring layer 25, and the insulating layer 24 and to expose one surface of the wiring layer 23. For example, the cavity 15 is formed such that the opening pattern 25x and the one surface (upper surface) of the wiring layer 25 surrounding the opening pattern 25x are exposed from the insulating layer 26. The planar shape of the cavity 15 is, for example, a rectangle. In the cavity 15, the electronic component 60 is mounted on the one surface of the wiring layer 23 via an adhesive 61. The planar shape of the electronic component 60 is, for example, a rectangle. The electronic component 60 is, for example, a semiconductor chip. The electronic component 60 may be a passive element such as a capacitor, an inductor, or a resistor. The electronic component 60 may also be a CSP (chip size package) in which rewiring is formed in a semiconductor chip. Alternatively, they may be mixed. The electronic component 60 includes electrode pads 62 on the one side.

The insulating layer 28 is formed on the one surface of the insulating layer 26 so as to fill the cavity 15 and to cover the wiring layer 27 and the electronic component 60. The material and the thickness of the insulating layer 28 can be, for example, similar to those of the insulating layer 22. Also, the insulating layer 28 may include a filler such as silica ($SiO_2$).

The wiring layer 29 is formed on the one side of the insulating layer 28. The wiring layer 29 is configured to include via wirings filling via holes 28x that penetrate the insulating layer 28 and expose the one surface of the wiring layer 27 and include a wiring pattern formed on the one surface of the insulating layer 28. Each of the via holes 28x is a recessed portion having a truncated cone shape in which the area of the opening portion opened on the solder resist layer 41 side is larger than the area of the bottom surface of the opening portion formed by the one surface of the wiring layer 27. The material and the thickness of the wiring layer 29 can be similar to those of the wiring layer 23, for example.

The solder resist layer 41 is formed on the one surface of the insulating layer 28 so as to cover the wiring layer 29. The solder resist layer 41 can be formed of, for example, a photosensitive resin such as an epoxy-based resin or an acrylic resin or the like. The thickness of the solder resist layer 41 can be, for example, approximately 30 µm to 70 µm.

The solder resist layer 41 has opening portions 41x, and a portion of the wiring layer 29 is exposed within each of the opening portions 41x. The wiring layer 29 exposed in the opening portions 41x functions as pads that are electrically connected to a semiconductor chip or the like (not illustrated). Thus, the wiring layer 29 exposed in the opening portions 41x may be referred to as first pads 29.

On one surface of the first pads 29, a metal layer may be formed, or an antioxidant treatment such as an OSP (Organic Solderability Preservative) treatment may be applied. Examples of the metal layer include an Au layer, a Ni/Au layer (a metal layer made by layering a Ni layer and an Au layer in this order), a Ni/Pd/Au layer (a metal layer made by layering a Ni layer, a Pd layer, and an Au layer in this order), and the like. The thickness of the metal layer can be, for example, approximately 0.03 µm to 10 µm.

The external connection terminals 42 are provided on one surface of the first pads 29. For example, a solder ball or the like may be used as the external connection terminals 42. As the material of the solder ball, for example, an alloy containing Pb, an alloy of Sn and Cu, an alloy of Sn and Sb, an alloy of Sn and Ag, an alloy of Sn, Ag, and Cu, or the like can be used.

It should be noted that the solder resist layer 41 may be provided to completely expose the wiring layer 29. In this case, the solder resist layer 41 may be provided such that the side surface of the wiring layer 29 and the side surface of the solder resist layer 41 are in contact with each other, or the solder resist layer 41 may be provided such that a gap is formed between the side surface of the wiring layer 29 and the side surface of the solder resist layer 41.

It should be noted that the wiring pattern constituting the wiring layer 29 may be formed by drawing out the wiring pattern to the one surface of the insulating layer 28, and the opening portions 41x may be formed on the wiring pattern drawn out on the one surface of the insulating layer 28. That is, the opening portions 41x may be arranged at portions other than on the via holes 28x of the wiring layer 29. Also, the external connection terminals 42 may not be provided.

The insulating layer 32 is formed on the other surface of the core layer 11 so as to cover the wiring layer 31. The material and the thickness of the insulating layer 32 can be, for example, similar to those of the insulating layer 22. Also, the insulating layer 32 may include a filler such as silica ($SiO_2$).

The wiring layer 33 is formed on the other side of the insulating layer 32. The wiring layer 33 is configured to include via wirings filling via holes 32x that penetrate the insulating layer 32 and expose the other surface of the wiring layer 31 and include a wiring pattern formed on the other surface of the insulating layer 32. Each of the via holes 32x is a recessed portion having a truncated cone shape in which the area of the opening portion opened on the insulating layer 34 side is larger than the area of the bottom surface of the opening portion formed by the other surface of the wiring layer 31. The material and the thickness of the wiring layer 33 can be similar to those of the wiring layer 23, for example.

The insulating layer 34 is formed on the other surface of the insulating layer 32 so as to cover the wiring layer 33. The material and the thickness of the insulating layer 34 can be, for example, similar to those of the insulating layer 22. Also, the insulating layer 34 may include a filler such as silica (SiO$_2$).

The wiring layer 35 is formed on the other side of the insulating layer 34. The wiring layer 35 is configured to include via wirings filling via holes 34$x$ that penetrate the insulating layer 34 and expose the other surface of the wiring layer 33 and include a wiring pattern formed on the other surface of the insulating layer 34. Each of the via holes 34$x$ is a recessed portion having a truncated cone shape in which the area of the opening portion opened on the insulating layer 36 side is larger than the area of the bottom surface of the opening portion formed by the other surface of the wiring layer 33. The material and the thickness of the wiring layer 35 can be similar to those of the wiring layer 23, for example.

The insulating layer 36 is formed on the other surface of the insulating layer 34 so as to cover the wiring layer 35. The material and the thickness of the insulating layer 36 can be, for example, similar to those of the insulating layer 22. Also, the insulating layer 36 may include a filler such as silica (SiO$_2$).

The wiring layer 37 is formed on the other side of the insulating layer 36. The wiring layer 37 is configured to include via wirings filling via holes 36$x$ that penetrate the insulating layer 36 and expose the other surface of the wiring layer 35 and include a wiring pattern formed on the one surface of the insulating layer 36. Each of the via holes 36$x$ is a recessed portion having a truncated cone shape in which the area of the opening portion opened on the insulating layer 38 side is larger than the area of the bottom surface of the opening portion formed by the other surface of the wiring layer 35. The material and the thickness of the wiring layer 37 can be similar to those of the wiring layer 23, for example.

The insulating layer 38 is formed on the other surface of the insulating layer 36 so as to cover the wiring layer 37. The material and the thickness of the insulating layer 38 can be, for example, similar to those of the insulating layer 22. Also, the insulating layer 38 may include a filler such as silica (SiO$_2$).

The wiring layer 39 is formed on the other side of the insulating layer 38. The wiring layer 39 is configured to include via wirings filling via holes 38$x$ that penetrate the insulating layer 38 and expose the one surface of the wiring layer 37 and include a wiring pattern formed on the other surface of the insulating layer 38. Each of the via holes 38$x$ is a recessed portion having a truncated cone shape in which the area of the opening portion opened on the solder resist layer 51 side is larger than the area of the bottom surface of the opening portion formed by the other surface of the wiring layer 37. The material and the thickness of the wiring layer 39 can be similar to those of the wiring layer 23, for example.

The solder resist layer 51 is formed on the other surface of the insulating layer 38 so as to cover the wiring layer 39. The material and the thickness of the solder resist layer 51 can be similar to those of the solder resist layer 41, for example.

The solder resist layer 51 has opening portions 51$x$, and a portion of the wiring layer 39 is exposed within each of the opening portions 51$x$. The wiring layer 39 exposed in the opening portions 51$x$ functions as pads that are electrically connected to a mounting board such as a motherboard (not illustrated). Thus, the wiring layer 39 exposed in the opening portions 51$x$ may be referred to as second pads 39. It should be noted that the planar shape of the second pads 39 is larger than the planar shape of the first pads 29, and the pitch of the second pads 39 is wider than the pitch of the first pads 29.

On the other surface of the second pads 39, a metal layer may be formed, or an antioxidant treatment such as an OSP (Organic Solderability Preservative) treatment may be applied. Examples of the metal layer include an Au layer, a Ni/Au layer (a metal layer made by layering a Ni layer and an Au layer in this order), a Ni/Pd/Au layer (a metal layer made by layering a Ni layer, a Pd layer, and an Au layer in this order), and the like. The thickness of the metal layer can be, for example, approximately 0.03 μm to 10 μm. Also, external connection terminals such as solder balls and lead pins may be formed on the other surface of the second pads 39.

It should be noted that the wiring pattern constituting the wiring layer 39 may be formed by drawing out the wiring pattern on the insulating layer 38, and the opening portions 51$x$ may be formed on the wiring pattern drawn out on the insulating layer 38. That is, the opening portions 51$x$ may be arranged at portions other than on the via holes 38$x$ of the wiring layer 39.

[Configuration of Reference Pattern]

Here, the reference patterns 110$a$, 110$b$, 110$c$, 110$d$, 120$a$, 120$b$, 120$c$ and 120$d$ will be described in detail.

As illustrated in FIG. 2, the wiring layer 23 is provided with a component mounting area 160 on which the electronic component 60 is to be mounted. The planar shape of the component mounting area 160 is, similar to the planar shape of the electronic component 60, for example, a rectangle having a pair of sides 160A and 160C, which are parallel to each other, and a pair of sides 160B and 160D, which are parallel to each other. The sides 160A and 160C and the sides 160B and 160D are orthogonal to each other. The side 160A overlaps the side surface 60$a$ of the electronic component 60 (see FIG. 4), the side 160B overlaps the side surface 60$b$ of the electronic component 60 (see FIG. 4), the side 160C overlaps the side surface 60$c$ of the electronic component 60 (see FIG. 4), and the side 160D overlaps the side surface 60$d$ of the electronic component 60 (see FIG. 4).

In addition, the wiring layer 23 is provided with a cavity forming area 115 that is going to overlap with the cavity 15 in plan view. The planar shape of the cavity forming area 115, is similar to the planar shape of the cavity 15, for example, a rectangle having a pair of sides 115A and 115C, which are parallel to each other, and a pair of sides 115B and 115D, which are parallel to each other. The sides 115A and 115C and the sides 115B and 115D are orthogonal to each other. The side 115A overlaps the side surface 25$a$ (see FIG. 4) of the opening pattern 25$x$, the side 115B overlaps the side surface 25$b$ (see FIG. 4) of the opening pattern 25$x$, the side 115C overlaps the side surface 25$c$ (see FIG. 4) of the opening pattern 25$x$, and the side 115D overlaps the side surface 25$d$ (see FIG. 4) of the opening pattern 25$x$.

In plane view, the cavity forming area 115 surrounds the component mounting area 160. As viewed from the component mounting area 160, the side 115A is located in parallel to the side 160A and outside the side 160A, the side 115B is located in parallel to the side 160B and outside the side 160B, the side 115C is located in parallel to the side 160C and outside the side 160C, and the side 115D is located in parallel to the side 160D and outside the side 160D.

The reference patterns 110$a$ cross at least the side 160A. The reference patterns 110$a$ include, for example, a plurality of slits that are arranged at regular intervals and that penetrate the wiring layer 23. The reference patterns 110a have, for example, a V-shaped planar shape that bends within the component mounting area 160 such that the two linear portions of the V shape each crosses the side 160A. Although the two reference patterns 110a are formed to cross the side 160A in the present embodiment, the number of reference patterns 110a crossing the side 160A may be one or may be three or more. The reference patterns 110a may also cross the side 115A in addition to the side 160A. Each of the two linear portions of the reference pattern 110a is an example of a first portion.

The reference pattern 110b crosses at least the side 160B. The reference pattern 110b includes, for example, a plurality of slits that are arranged at regular intervals and that penetrate the wiring layer 23. The reference pattern 110b has, for example, a V-shaped planar shape that bends within the component mounting area 160 such that the two linear portions of the V shape each crosses the side 160B. Although the single reference pattern 110b is formed to cross the side 160B in the present embodiment, the number of reference patterns 110b crossing the side 160B may be two or more. The reference pattern 110b may also cross the side 115B in addition to the side 160B. Each of the two linear portions of the reference patterns 110b is an example of a first portion.

The reference patterns 110C cross at least the side 160C. The reference patterns 110c include, for example, a plurality of slits that are arranged at regular intervals and that penetrate the wiring layer 23. The reference patterns 110c have, for example, a V-shaped planar shape that bends within the component mounting area 160 such that the two linear portions of the V shape each crosses the side 160C. Although the two reference patterns 110c are formed to cross the side 160C in the present embodiment, the number of reference patterns 110c crossing the side 160C may be one or may be three or more. The reference patterns 110c may also cross the side 115C in addition to the side 160C. Each of the two linear portions of the reference patterns 110c is an example of a first portion.

The reference pattern 110d crosses at least the side 160D. The reference pattern 110d includes, for example, a plurality of slits that are arranged at regular intervals and that penetrate the wiring layer 23. The reference pattern 110d has, for example, a V-shaped planar shape that bends within the component mounting area 160 such that the two linear portions of the V shape each crosses the side 160D. Although the single reference pattern 110d is formed to cross the side 160D in the present embodiment, the number of reference patterns 110d crossing the side 160D may be two or more. The reference pattern 110d may also cross the side 115D in addition to the side 160D. Each of the two linear portions of the reference pattern 110d is an example of a first portion.

The reference patterns 120a cross at least the side 115A. The reference patterns 120a include, for example, a plurality of slits that are arranged at regular intervals and that penetrate the wiring layer 23. The reference patterns 120a have, for example, a V-shaped planar shape that bends within the cavity forming area 115 such that the two linear portions of the V shape each crosses the side 115A. Although the two reference patterns 120a are formed to cross the side 115A in the present embodiment, the number of reference patterns 120a crossing the side 115A may be one or may be three or more. The reference patterns 120a may also cross the side 160A in addition to the side 115A. Each of the two linear portions of the reference patterns 120a is an example of a second portion.

The reference pattern 120b crosses at least the side 115B. The reference pattern 120b includes, for example, a plurality of slits that are arranged at regular intervals and that penetrate the wiring layer 23. The reference pattern 120b has, for example, a V-shaped planar shape that bends within the cavity forming area 115 such that the two linear portions of the V shape each crosses the side 115B. Although the single reference pattern 120b is formed to cross the side 115B in the present embodiment, the number of reference patterns 120b crossing the side 115B may be two or more. The reference pattern 120b may also cross the side 160B in addition to the side 115B. Each of the two linear portions of the reference pattern 120b is an example of a second portion.

The reference patterns 120c cross at least the side 115C. The reference patterns 120c include, for example, a plurality of slits that are arranged at regular intervals and that penetrate the wiring layer 23. The reference patterns 120c have, for example, a V-shaped planar shape that bends within the cavity forming area 115 such that the two linear portions of the V shape each crosses the side 115C. Although the two reference patterns 120c are formed to cross the side 115C in the present embodiment, the number of reference patterns 120c crossing the side 115C may be one or may be three or more. The reference patterns 120c may also cross the side 160C in addition to the side 115C. Each of the two linear portions of the reference patterns 120c is an example of a second portion.

The reference pattern 120d crosses at least the side 115D. The reference pattern 120d includes, for example, a plurality of slits that are arranged at regular intervals and that penetrate the wiring layer 23. The reference pattern 120d has, for example, a V-shaped planar shape that bends within the cavity forming area 115 such that the two linear portions of the V shape each crosses the side 115D. Although the single reference pattern 120d is formed to cross the side 115D in the present embodiment, the number of reference patterns 120d crossing the side 115D may be two or more. The reference pattern 120d may also cross the side 160D in addition to the side 115D. Each of the two linear portions of the reference pattern 120D is an example of a second portion.

[Configuration of Slits]

Figure 3:
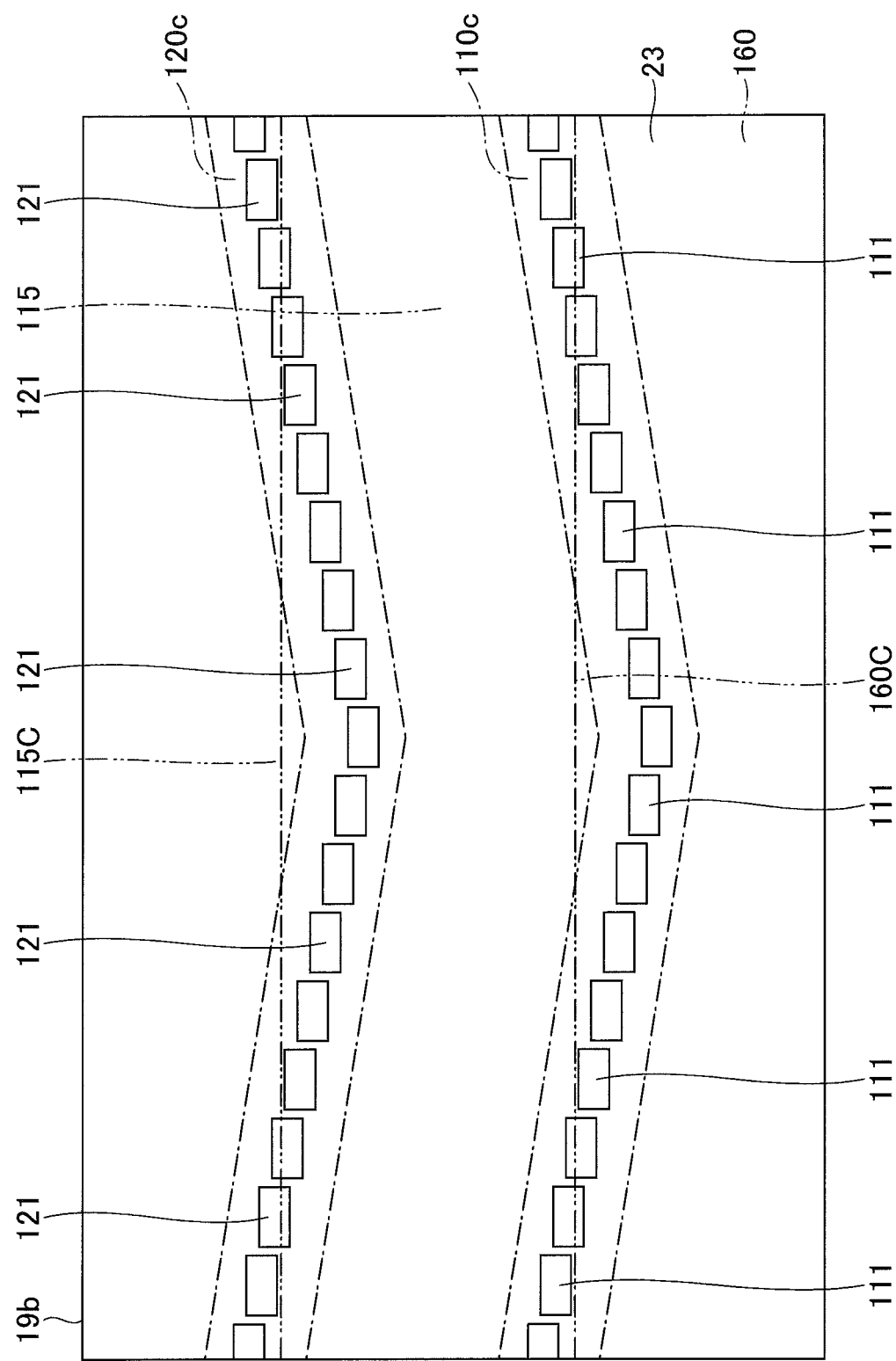
FIG. 3 is a diagram illustrating slits included in reference patterns.

Next, slits included in the reference patterns 110a, 110b, 110c, 110d, 120a, 120b, 120c, and 120d will be described. Here, as a representative, slits included in the reference patterns 110c and 120c will be first described with reference to FIG. 3. FIG. 3 is a diagram illustrating slits included in the reference patterns 110c and 120c. FIG. 3 illustrates the configuration within an area 19b surrounded by a double-dot chain line in FIG. 2. Slits included in reference patterns 110a, 110b, 110c, 110d, 120a, 120b, 120c, and 120d are an example of a scale.

As illustrated in FIG. 3, the reference patterns 110c include, for example, a plurality of slits 111 that are arranged to constitute a V shape in plan view and that penetrate the wiring layer 23. For example, the planar shape of each slit 111 may be a rectangle of which two sides parallel to the side 160C have a length of 10 μm and two sides perpendicular to the side 160C have a length of 5 μm. The plurality of slits 111 are arranged at regular intervals in directions inclined from the direction parallel to the side 160C so as to form the V shape. For example, the intervals in the direction parallel to the side 160C are 5 μm and the intervals in the direction perpendicular to the side 160C are 1 μm. For example, the number of slits 111 included in the reference pattern 110c is 101, and the slit 111 located at the center of the arrangement in the direction parallel to the side 160C is located at the bending point of the letter of V. Also, for example, when the electronic component 60 is mounted as designed, which slits 111 at $N_{C1}$th from both ends are preset to be traversed by the electronic component 60. In the example illustrated in FIG. 3, the slits 111 are formed so that slits 111 at 44th and 45th from both ends are traversed by the electronic component 60 when the electronic component 60 is mounted as designed. The total number of slits 111 included in the reference pattern 110c and the value of $N_{C1}$ are set as desired. It should be noted that in order to illustrate an overall arrangement of the plurality of slits 111, for convenience, with respect to the lengths (10 μm, 5 μm) of the respective sides of the slits 111, FIG. 3 illustrates the intervals (5 μm) of the slits 111 in the direction parallel to the side 160C in a shortened manner. The same applies to FIG. 22 to FIG. 26 and FIG. 28.

Similarly, the reference patterns 120c include, for example, a plurality of slits 121 that are arranged to constitute a V shape in plan view and that penetrate the wiring layer 23. For example, the planar shape of each slit 121 may be a rectangle of which two sides parallel to the side 115C have a length of 10 μm and two sides perpendicular to the side 115C have a length of 5 μm. The plurality of slits 121 are arranged at regular intervals in directions inclined from the direction parallel to the side 115C so as to form the V shape. For example, the intervals in the direction parallel to the side 115C are 5 m and the intervals in the direction perpendicular to the side 115C are 1 μm. For example, the number of slits 121 included in the reference pattern 120c is 101, and the slit 121 located at the center of the arrangement in the direction parallel to the side 115C is located at the bending point of the letter of V. Also, for example, when the cavity 15 is formed as designed, slits 121 at $N_{C2}$th from both ends are preset to be traversed by the opening pattern 25x of the wiring layer 25. In the example illustrated in FIG. 3, the slits 121 are formed so that slits 121 at 44th and 45th from both ends are traversed by the opening pattern 25X when the cavity 15 is formed as designed. The total number of slits 121 included in the reference pattern 120c and the value of $N_{C2}$ are set as desired. It should be noted that in order to illustrate an overall arrangement of the plurality of slits 121, for convenience, with respect to the lengths (10 μm, 5 μm) of the respective sides of the slits 121, FIG. 3 illustrates the intervals (5 μm) of the slits 121 in the direction parallel to the side 115C in a shortened manner. The same applies to FIG. 22 to FIG. 26 and FIG. 28.

The reference patterns 110a have a configuration similar to that of the reference patterns 110c. That is, although the illustration is omitted, the reference patterns 110a include, for example, a plurality of slits 111 that are arranged to constitute a V shape in plan view and that penetrate the wiring layer 23. The plurality of slits 111 are arranged at regular intervals in directions inclined from the direction parallel to the side 160A so as to form the V shape. For example, the number of slits 111 included in the reference pattern 110a is 101, and the slit 111 located at the center of the arrangement in the direction parallel to the side 160A is located at the bending point of the letter of V. Also, for example, when the electronic component 60 is mounted as designed, slits 1l at $N_{A1}$th from both ends are preset to be traversed by the electronic component 60. The total number of slits 111 included in the reference pattern 110a and the value of $N_{A1}$ are set as desired.

The reference pattern 110b has a configuration similar to that of the reference patterns 110c. That is, although the illustration is omitted, the reference pattern 110b includes, for example, a plurality of slits 111 that are arranged to constitute a V shape in plan view and that penetrate the wiring layer 23. It should be noted that between the reference patterns 110c and the reference pattern 110b, the orientation of the slits 111 differs and the planar shape of the slits 111 included in the reference pattern 110b is a rectangle of which two sides parallel to the side 160B have a length of 10 μm and two sides perpendicular to the side 160B have a length of 5 μm. The plurality of slits 111 are arranged at regular intervals in directions inclined from the direction parallel to the side 160B so as to form the V shape. For example, the number of slits 111 included in the reference pattern 110b is 101, and the slit 111 located at the center of the arrangement in the direction parallel to the side 160B is located at the bending point of the letter of V. Also, for example, when the electronic component 60 is mounted as designed, slits 111 at $N_{B1}$th from both ends are preset to be traversed by the electronic component 60. The total number of slits 111 included in the reference pattern 110b and the value of $N_{B1}$ are set as desired.

The reference pattern 110d has a configuration similar to that of the reference pattern 110b. That is, although the illustration is omitted, the reference pattern 110d includes, for example, a plurality of slits 111 that are arranged to constitute a V shape in plan view and that penetrate the wiring layer 23. The plurality of slits 111 are arranged at regular intervals in directions inclined from the direction parallel to the side 160D so as to form the V shape. For example, the number of slits 111 included in the reference pattern 110d is 101, and the slit 111 located at the center of the arrangement in the direction parallel to the side 160D is located at the bending point of the letter of V. Also, for example, when the electronic component 60 is mounted as designed, slits 111 at $N_{D1}$th from both ends are preset to be traversed by the electronic component 60. The total number of slits 111 included in the reference pattern 110d and the value of $N_{D1}$ are set as desired.

The reference patterns 120a have a configuration similar to that of the reference patterns 120c. That is, although the illustration is omitted, the reference patterns 120a include, for example, a plurality of slits 121 that are arranged to constitute a V shape in plan view and that penetrate the wiring layer 23. The plurality of slits 121 are arranged at regular intervals in directions inclined from the direction parallel to the side 115A so as to form the V shape. For example, the number of slits 121 included in the reference pattern 120a is 101, and the slit 121 located at the center of the arrangement in the direction parallel to the side 115A is located at the bending point of the letter of V. Also, for example, when the cavity 15 is formed as designed, slits 121 at $N_{A2}$th from both ends are preset to be traversed by the opening pattern 25x of the wiring layer 25. The total number of slits 121 included in the reference pattern 120a and the value of $N_{A2}$ are set as desired.

The reference pattern 120b has a configuration similar to that of the reference patterns 120c. That is, although the illustration is omitted, the reference pattern 120b includes, for example, a plurality of slits 121 that are arranged to constitute a V shape in plan view and that penetrate the wiring layer 23. It should be noted that between the reference patterns 120c and the reference pattern 120b, the orientation of the slits 121 differs and the planar shape of the slits 121 included in the reference pattern 120b is a rectangle of which two sides parallel to the side 115B have a length of 10 μm and two sides perpendicular to the side 115B have a length of 5 μm. The plurality of slits 121 are arranged at regular intervals in directions inclined from the direction parallel to the side 115B so as to form the V shape. For example, the number of slits 121 included in the reference pattern 120b is 101, and the slit 121 located at the center of the arrangement in the direction parallel to the side 115B is located at the bending point of the letter of V. Also, for example, when the cavity 15 is formed as designed, slits 121 at $N_{B2}$th from both ends are preset to be traversed by the opening pattern 25x of the wiring layer 25. The total number of slits 121 included in the reference pattern 120b and the value of $N_{B2}$ are set as desired.

The reference pattern 120d has a configuration similar to that of the reference pattern 120b. That is, although the illustration is omitted, the reference pattern 120d includes, for example, a plurality of slits 121 that are arranged to constitute a V shape in plan view and that penetrate the wiring layer 23. The plurality of slits 121 are arranged at regular intervals in directions inclined from the direction parallel to the side 115D so as to form the V shape. For example, the number of slits 121 included in the reference pattern 120d is 101, and the slit 121 located at the center of the arrangement in the direction parallel to the side 115D is located at the bending point of the letter of V. Also, for example, when the cavity 15 is formed as designed, slits 121 at $N_{D2}$th from both ends are preset to be traversed by the opening pattern 25x of the wiring layer 25. The total number of slits 121 included in the reference pattern 120d and the value of $N_{D2}$ are set as desired.

Figure 4:
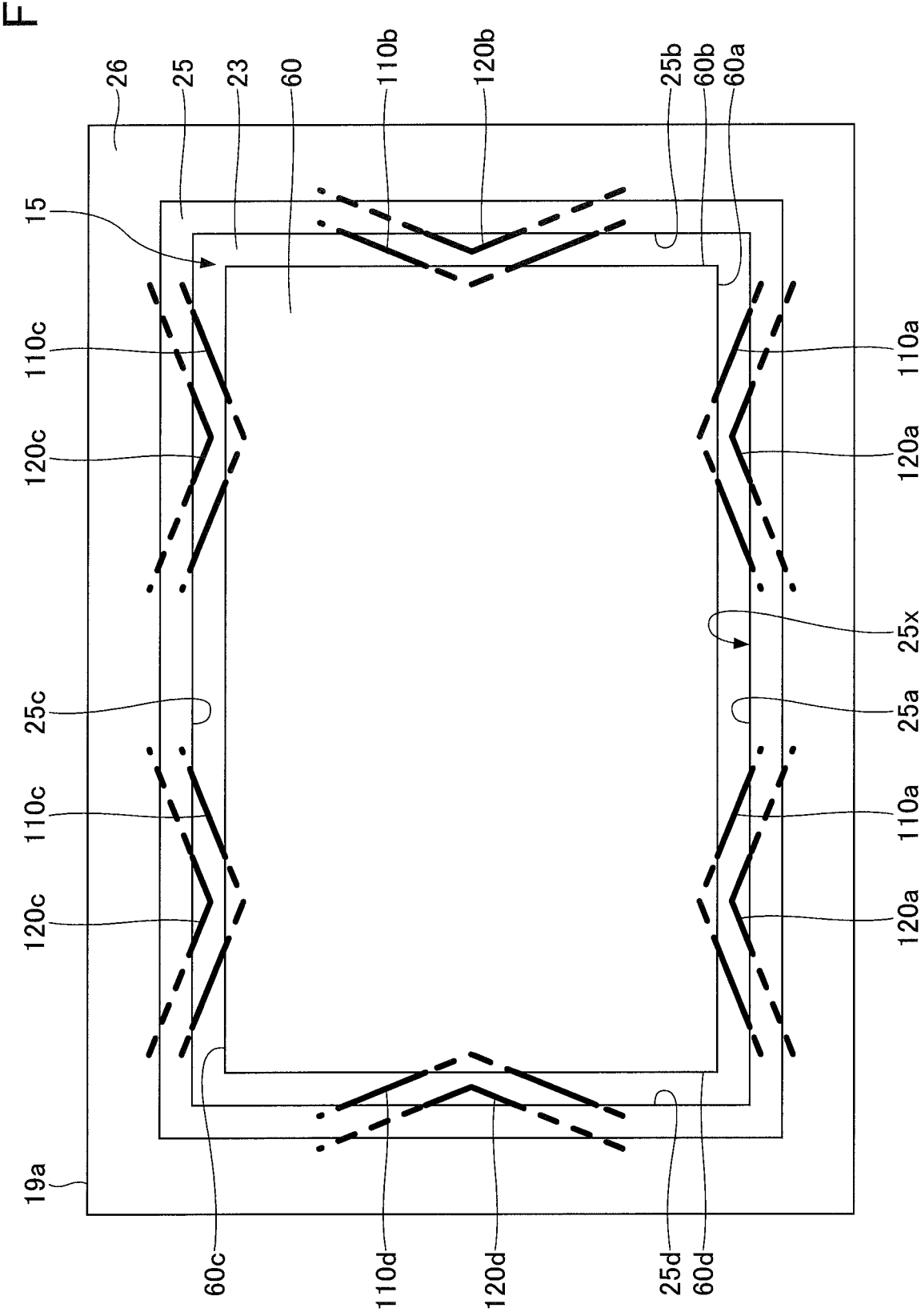
FIG. 4 is a diagram illustrating a positional relationship between wiring layers, a cavity, and an electronic component.

After the cavity 15 is formed and the electronic component 60 is mounted, the opening pattern 25x is exposed from the insulating layer 26, as illustrated in FIG. 4. Also, from the electronic component 60, at least a portion of each of the reference patterns 110a, 110b, 110c, and 110d is exposed, and from the wiring layer 25, at least a portion of each of the reference patterns 120a, 120b, 120c, and 120d is exposed.

Accordingly, after mounting the electronic component 60, in plan view, by specifying slits 111 that the side surface 60a of the electronic component 60 traverses in the reference patterns 110a, slits 111 that the side surface 60b traverses in the reference pattern 110b, slits 111 that the side surface 60c traverses in the reference patterns 110c, and slits 111 that the side surface 60d traverses in the reference pattern 110d, the positional accuracy of the electronic component 60 relative to the wiring layer 23 can be specified.

Because the wiring layer 25 can be formed with sufficient positional accuracy relative to the wiring layer 23, the positional accuracy of the electronic component 60 relative to the wiring layer 25 can also be specified from the positional accuracy of the electronic component 60 relative to the wiring layer 23.

Also, the side surface 25a of the opening pattern 25x can be regarded as matching a surface obtained by extending one side surface of the cavity 15 toward one side, the side surface 25b of the opening pattern 25x can be regarded as matching a surface obtained by extending another one side surface of the cavity 15 toward one side, the side surface 25c of the opening pattern 25x can be regarded as matching a surface obtained by extending another one side surface of the cavity 15 toward one side, and the side surface 25d of the opening pattern 25x can be regarded as matching a surface obtained by extending the remaining one side surface of the cavity 15 toward one side. Accordingly, after mounting the electronic component 60 or after forming the cavity 15, by specifying slits 121 that the side surface 25a of the opening pattern 25x traverses in the reference patterns 120a, slits 121 that the side surface 25b of the opening pattern 25x traverses in the reference pattern 120b, slits 121 that the side surface 25c of the opening pattern 25x traverses in the reference patterns 120c, and slits 121 that the side surface 25d of the opening pattern 25x traverses in the reference pattern 120d, the positional accuracy of the cavity 15 relative to the wiring layer 23 can be specified.

Thus, the positional relationship between the cavity 15 and the electronic component 60 can also be easily specified.

[Method of Manufacturing Substrate with Built-in Component]

Next, a method of manufacturing the substrate with built-in component 10 according to the first embodiment will be described. FIG. 5 to FIG. 17 are cross-sectional views illustrating a method of manufacturing the substrate with built-in component 10 according to the first embodiment. FIG. 18 to FIG. 21 are diagrams illustrating changes in the exposure state of the reference patterns in the method of manufacturing the substrate with built-in component 10 according to the first embodiment.

Figure 5:
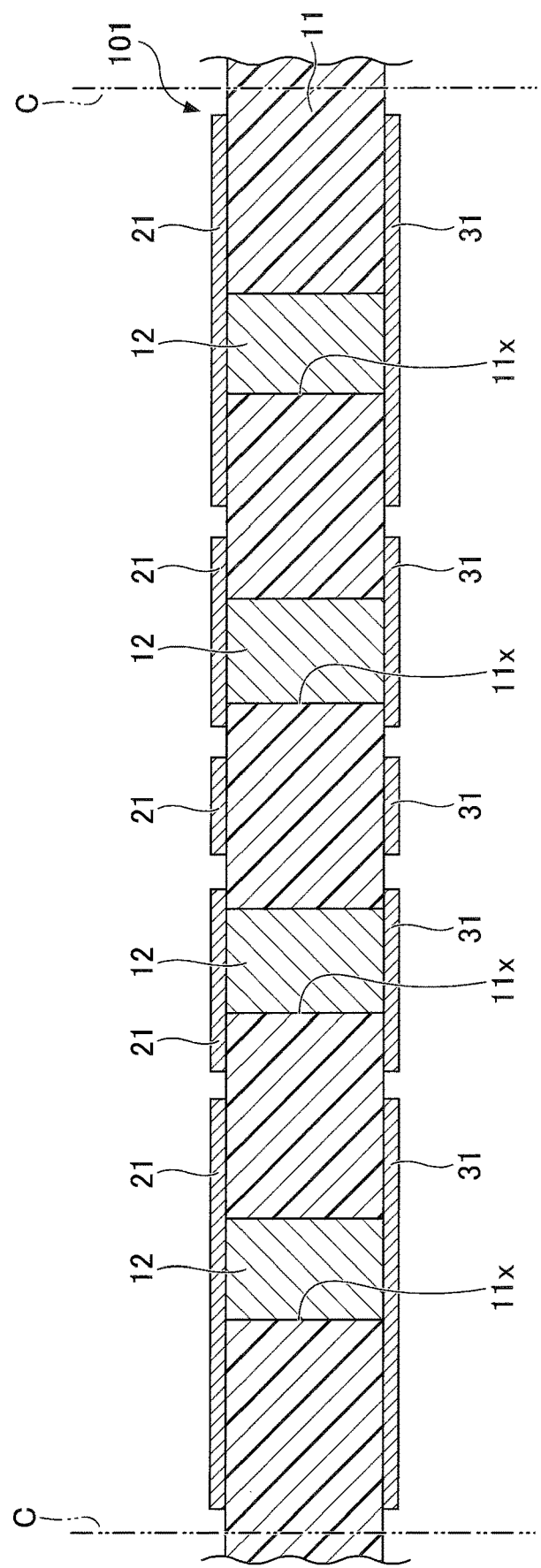
FIG. 5 is a cross-sectional view illustrating a step of a method of manufacturing the substrate with built-in component according to the first embodiment (part 1)

First, as illustrated in FIG. 5, a core wiring substrate 101 is prepared as a support. The core wiring substrate 101 includes a core layer 11, a wiring layer 21, a wiring layer 31, and through wirings 12. Through holes 11x are formed to penetrate the core layer 11 from the one surface to the other surface, and the through wirings 12 are formed in the through holes 11x. The through holes 11x can be formed by, for example, processing using a drill or a laser or the like. The wiring layer 21 is formed on the one surface of the core layer 11 and the wiring layer 31 is formed on the other surface of the core layer 11. The through wirings 12, the wiring layer 21, and the wiring layer 31 can be formed, for example, by a plating process, photolithography, and the like. It should be noted that as the core wiring substrate 101, a large-size substrate by which a plurality of substrates with built-in components 10 can be obtained is used. That is, the core wiring substrate 101 has a plurality of areas where structures corresponding to substrates with built-in components 10 are formed.

For example, as the core layer 11, a glass epoxy substrate obtained by impregnating a glass cloth with an epoxy-based resin or the like can be used. As the core layer 11, a substrate obtained by impregnating a woven fabric such as a glass fiber, a carbon fiber, or an aramid fiber or a non-woven fabric with an insulating resin such as an epoxy-based resin or a polyimide-based resin or the like may also be used. The thickness of the core layer 11 can be approximately 100 μm to 200 μm, for example. For example, copper (Cu) or the like can be used as the material of the through wirings 12, the wiring layer 21, and the wiring layer 31.

Figure 6:
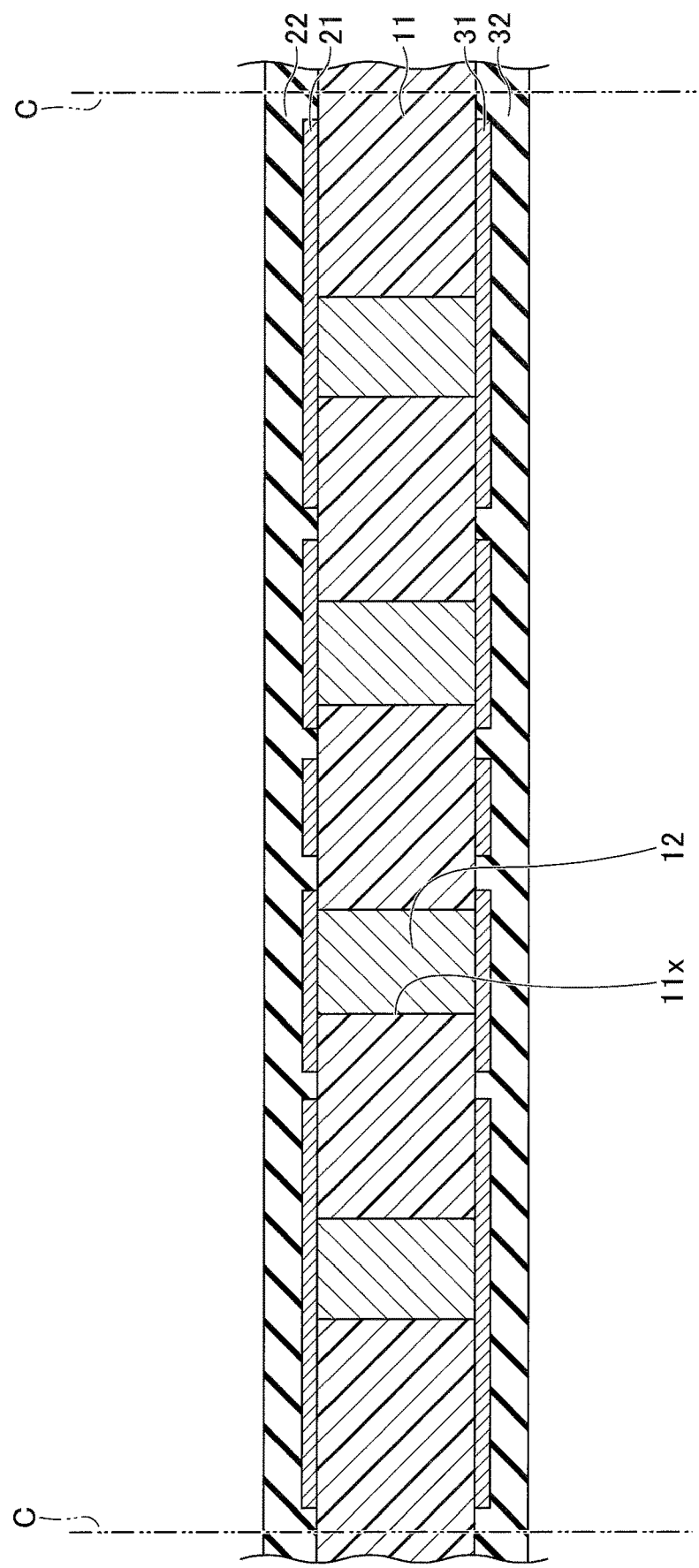
FIG. 6 is a cross-sectional view illustrating a step of the method of manufacturing the substrate with built-in component according to the first embodiment (part 2)

Next, as illustrated in FIG. 6, an insulating resin film, such as a film-like epoxy-based resin, is laminated on the one surface of the core layer 11 so as to cover the wiring layer 21 on one surface of the core layer 11 to form the insulating layer 22. Also, an insulating resin film, such as a film-like epoxy-based resin, is laminated on the other surface of the core layer 11 so as to cover the wiring layer 31 to form the insulating layer 32. Alternatively, instead of laminating a film-like epoxy-based resin, an insulating resin, such as a liquid or paste epoxy-based resin, may be applied and then be cured to form the insulating layers 22 and 32. The thickness of each of the insulating layers 22 and 32 can be, for example, approximately 30 μm to 70 μm. Also, each of the insulating layers 22 and 32 may include a filler such as silica ($SiO_2$).

Figure 7:
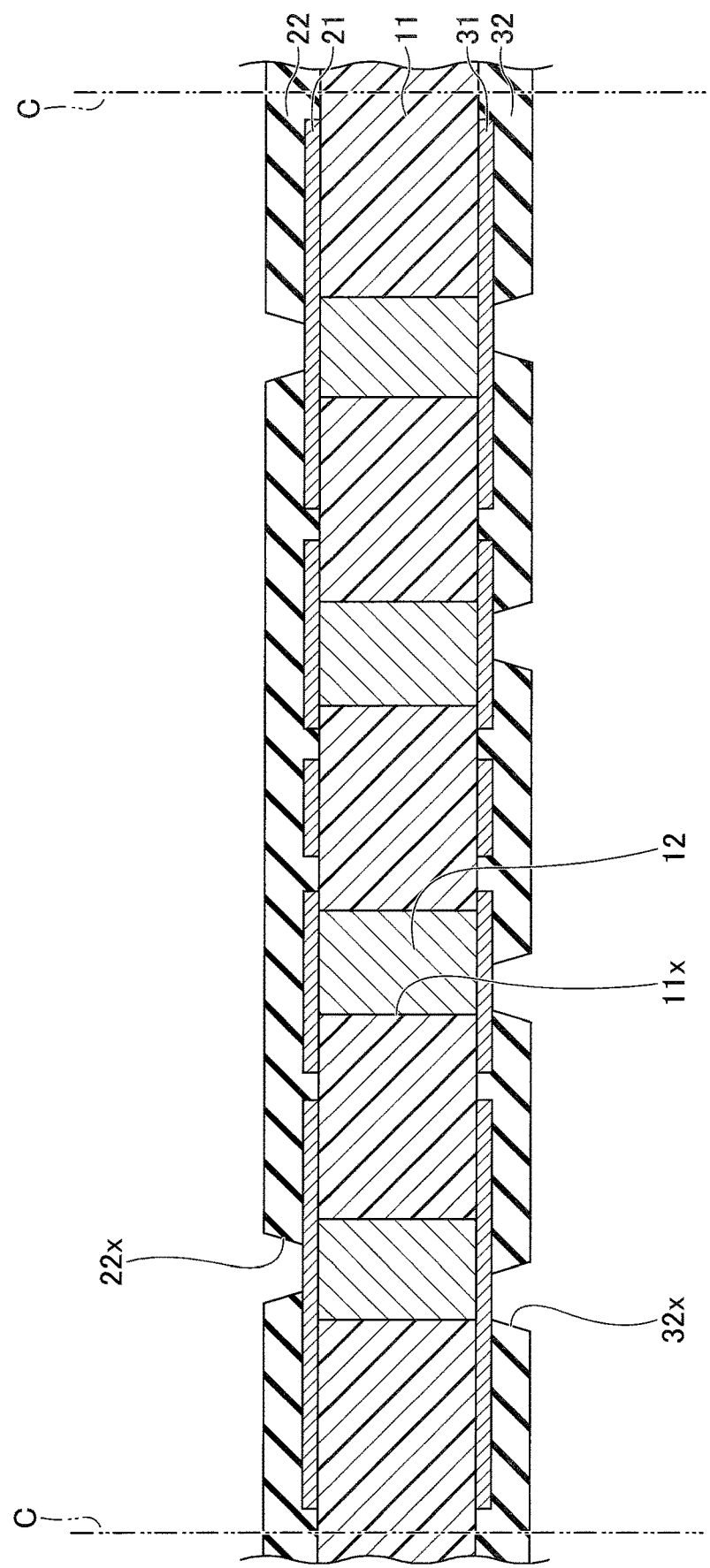
FIG. 7 is a cross-sectional view illustrating a step of the method of manufacturing the substrate with built-in component according to the first embodiment (part 3)

Next, as illustrated in FIG. 7, in the insulating layer 22, via holes 22x that penetrate the insulating layer 22 and expose the one surface of the wiring layer 21 are formed. Also, in the insulating layer 32, via holes 32x that penetrate the insulating layer 32 and expose the other surface of the wiring layer 31 are formed. The via holes 22x and 32x can be formed, for example, by laser processing using a $CO_2$ laser or the like. It is preferable that after the via holes 22x and 32x are formed, a desmear process is performed to remove resin residue adhered on the surfaces of the wiring layer 21 and wiring layer 31, which are respectively exposed at the bottom portions of the via holes 22x and 32x.

Figure 8:
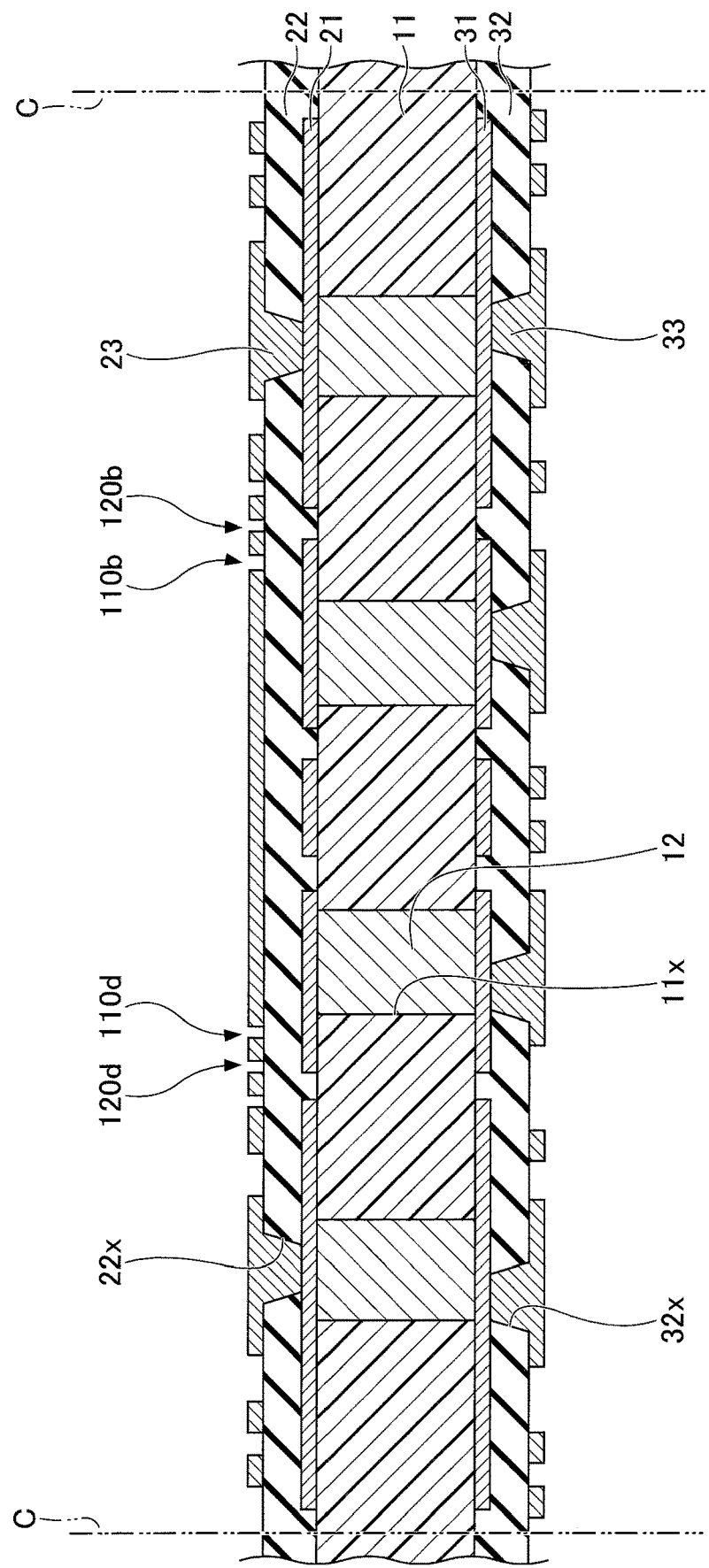
FIG. 8 is a cross-sectional view illustrating a step of the method of manufacturing the substrate with built-in component according to the first embodiment (part 4)
Figure 18:
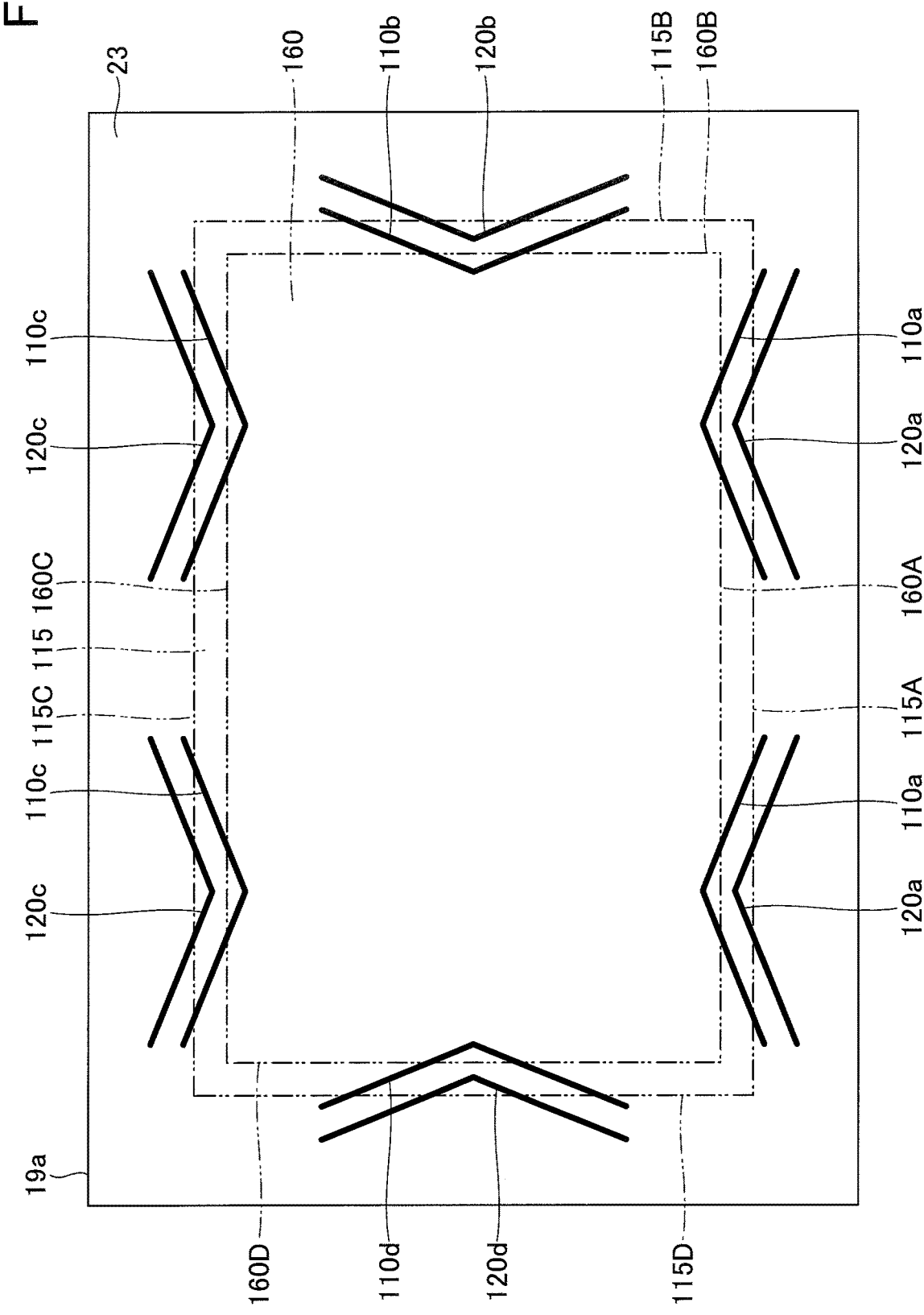
FIG. 18 is a diagram illustrating a change in the exposure state of the reference patterns in the method of manufacturing the substrate with built-in component according to the first embodiment (part 1)

Next, as illustrated in FIG. 8, the wiring layer 23 is formed on the one side of the insulating layer 22. The wiring layer 23 is configured to include via wirings filling the via holes 22x and include a wiring pattern formed on the one surface of the insulating layer 22. The wiring layer 23 is electrically connected to the wiring layer 21 exposed at the bottom portions of the via holes 22x. As illustrated in FIG. 18, the wiring layer 23 is formed to have reference patterns 110a to 110d including slits 111 (see FIG. 3) and reference patterns 120a to 120d including slits 121 (see FIG. 3).

Similarly, the wiring layer 33 is formed on the other side of the insulating layer 32. The wiring layer 33 is configured to include via wirings filling the via holes 32x and include a wiring pattern formed on the other surface of the insulating layer 32. The wiring layer 33 is electrically connected to the wiring layer 31 exposed at the bottom portions of the via holes 32x.

As a material of each of the wiring layers 23 and 33, for example, copper (Cu) or the like can be used. The thickness of each of the wiring layers 23 and 33 can be, for example, approximately 10 µm to 30 µm. Each of the wiring layers 23 and 33 can be formed by using various wiring forming methods such as a semi-additive method and a subtractive method.

Figure 9:
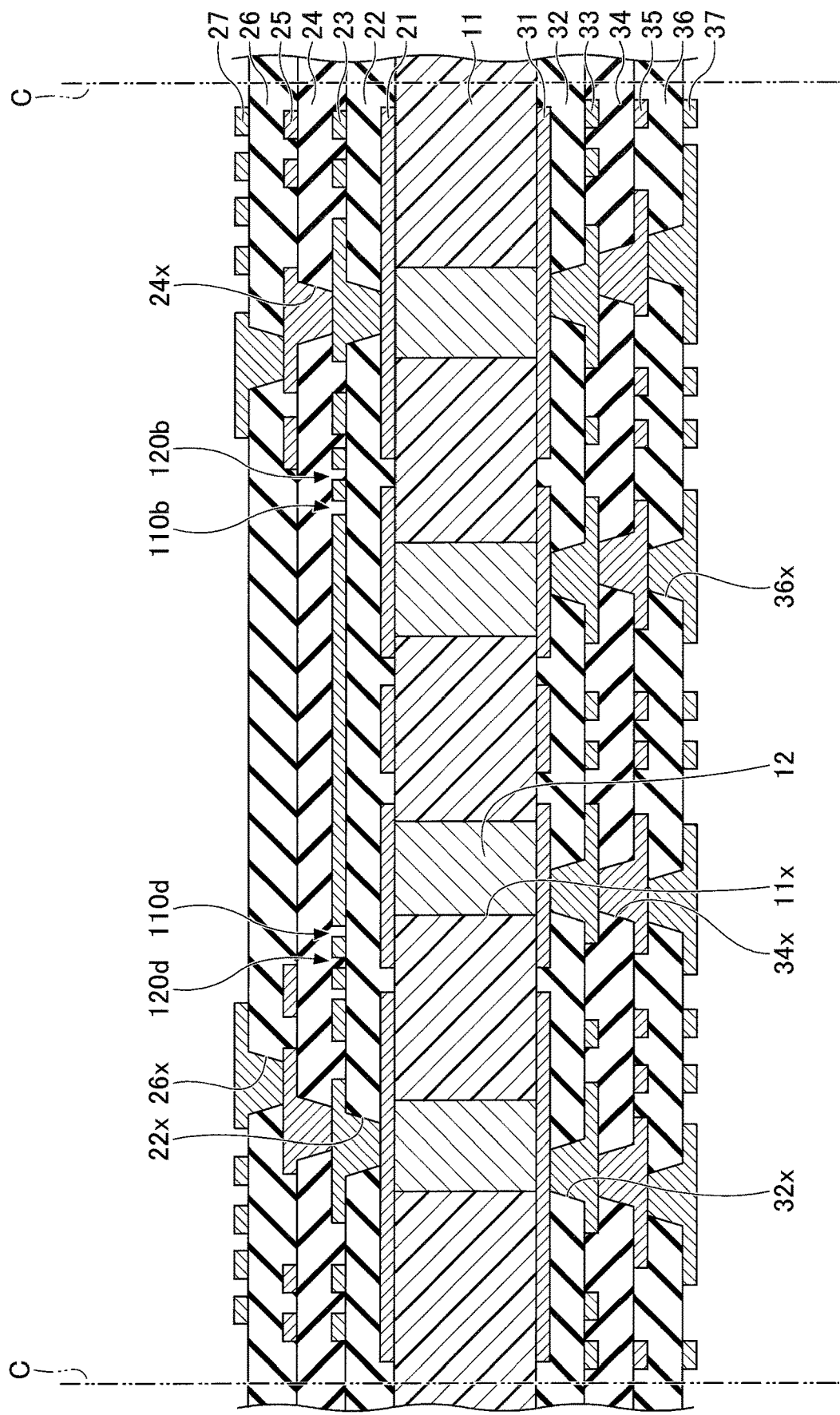
FIG. 9 is a cross-sectional view illustrating a step of the method of manufacturing the substrate with built-in component according to the first embodiment (part 5)

Next, as illustrated in FIG. 9, by repeating the steps illustrated in FIG. 6 to FIG. 8, the insulating layer 24, the wiring layer 25, the insulating layer 26, and the wiring layer 27 are sequentially layered over on the wiring layer 23. Also, the insulating layer 34, the wiring layer 35, the insulating layer 36, and the wiring layer 37 are sequentially layered on the wiring layer 33. It should be noted that the layered number of wiring layers and insulating layers can be as any number.

That is, the insulating layer 24 is formed on the one surface of the insulating layer 22 so as to cover the wiring layer 23. Similarly, the insulating layer 34 is formed on the other surface of the insulating layer 32 so as to cover the wiring layer 33. Then, via holes 24x that penetrate the insulating layer 24 and expose the one surface of the wiring layer 23 are formed. Similarly, via holes 34x that penetrate the insulating layer 34 and expose the other surface of the wiring layer 33 are formed. The thickness and the material of each of the insulating layers 24 and 34 can be, for example, similar to those of the insulating layer 22. Also, each of the insulating layers 24 and 34 may include a filler such as silica ($SiO_2$).

Further, the wiring layer 25 is formed on the one side of the insulating layer 24. The wiring layer 25 is configured to include via wirings filling the via holes 24x and include a wiring pattern formed on the one surface of the insulating layer 24. The wiring layer 25 is electrically connected to the wiring layer 23 exposed in the via holes 24x. Similarly, the wiring layer 35 is formed on the other side of the insulating layer 34. The wiring layer 35 is configured to include via wirings filling the via holes 34x and include a wiring pattern formed on the other surface of the insulating layer 34. The wiring layer 35 is electrically connected to the wiring layer 33 exposed in the via holes 34x. The material and the thicknesses of each of the wiring layers 25 and 35 can be similar to, for example, those of the wiring layer 23.

Figure 19:
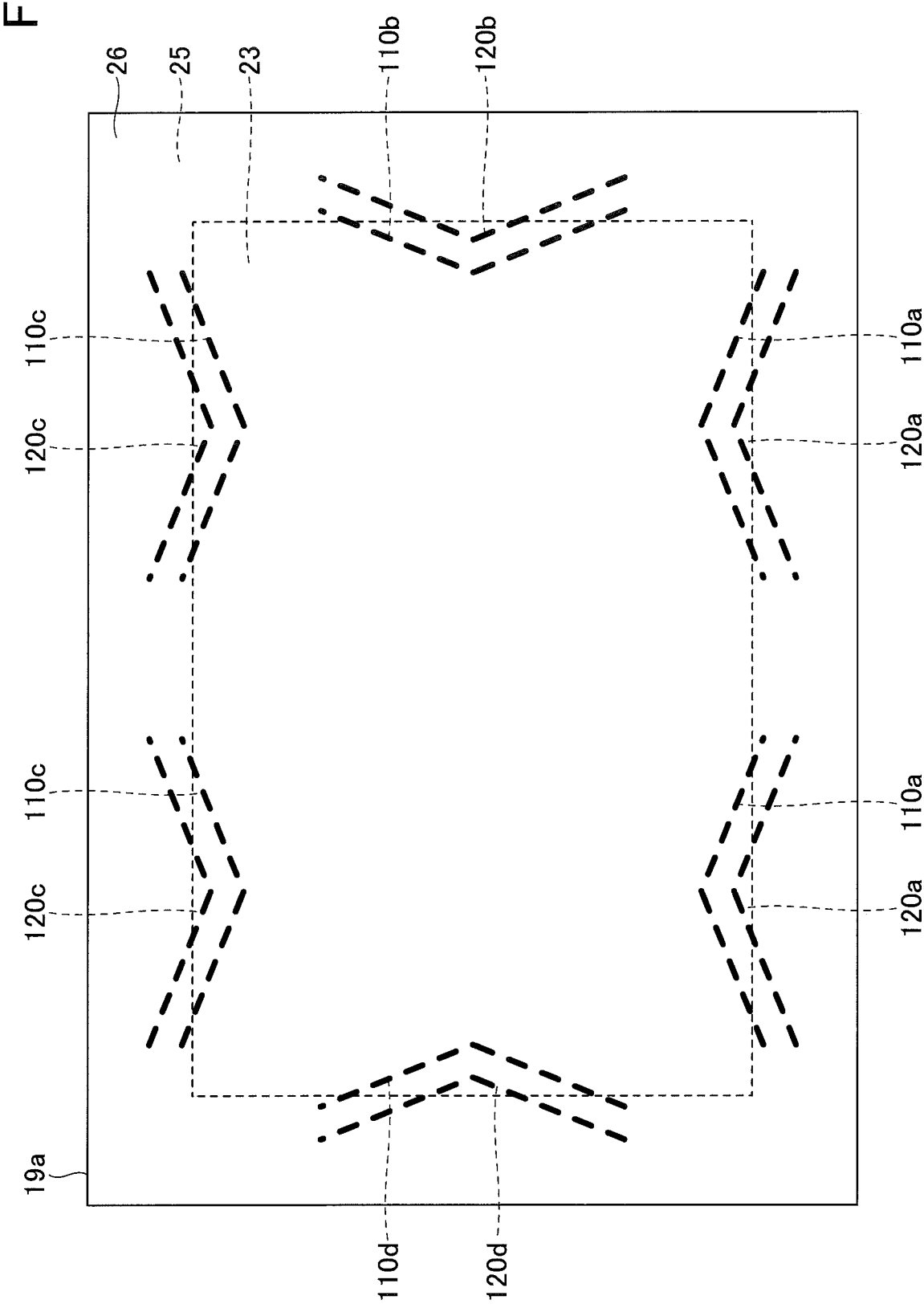
FIG. 19 is a diagram illustrating a change in the exposure state of the reference patterns in the method of manufacturing the substrate with built-in component according to the first embodiment (part 2)

Further, the insulating layer 26 is formed on the one surface of the insulating layer 24 so as to cover the wiring layer 25. Similarly, the insulating layer 36 is formed on the other surface of the insulating layer 34 so as to cover the wiring layer 35. After the insulating layer 24, the wiring layer 25, the insulating layer 26, and the wiring layer 27 are formed, as illustrated in FIG. 19, the reference patterns 110a to 110d and the reference patterns 120a to 120d formed in the wiring layer 23 are hidden by the insulating layer 26 and the insulating layer 24 (see FIG. 9). Then, via holes 26x that penetrate the insulating layer 26 and expose the one surface of the wiring layer 25 are formed. Similarly, via holes 36x that penetrate the insulating layer 36 and expose the other surface of the wiring layer 35 are formed. The thickness and the material of each of the insulating layers 26 and 36 can be, for example, similar to those of the insulating layer 22. Also, each of the insulating layers 26 and 36 may include a filler such as silica ($SiO_2$).

The wiring layer 27 is formed on the one side of the insulating layer 26. The wiring layer 27 is configured to include via wirings filling the via holes 26x and include a wiring pattern formed on the one surface of the insulating layer. The wiring layer 27 is electrically connected to the wiring layer 25 exposed in the via holes 26x. Similarly, the wiring layer 37 is formed on the other side of the insulating layer 36. The wiring layer 37 is configured to include via wirings filling the via holes 36x and include a wiring pattern formed on the other surface of the insulating layer 36. The wiring layer 37 is electrically connected to the wiring layer 35 exposed in the via holes 36x. The material and the thicknesses of each of the wiring layers 27 and 37 can be similar to, for example, those of the wiring layer 23.

Figure 10:
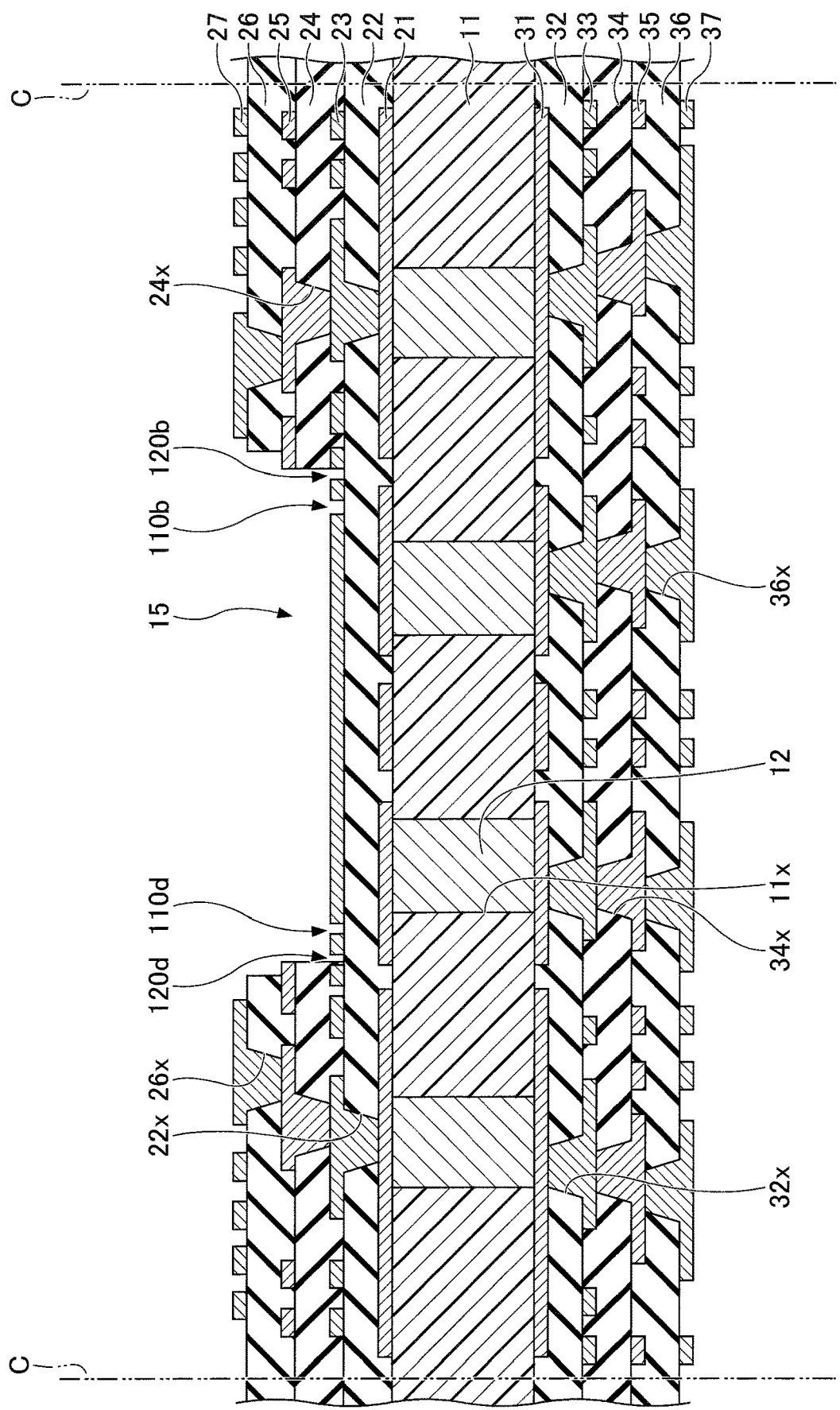
FIG. 10 is a cross-sectional view illustrating a step of the method of manufacturing the substrate with built-in component according to the first embodiment (part 6)
Figure 20:
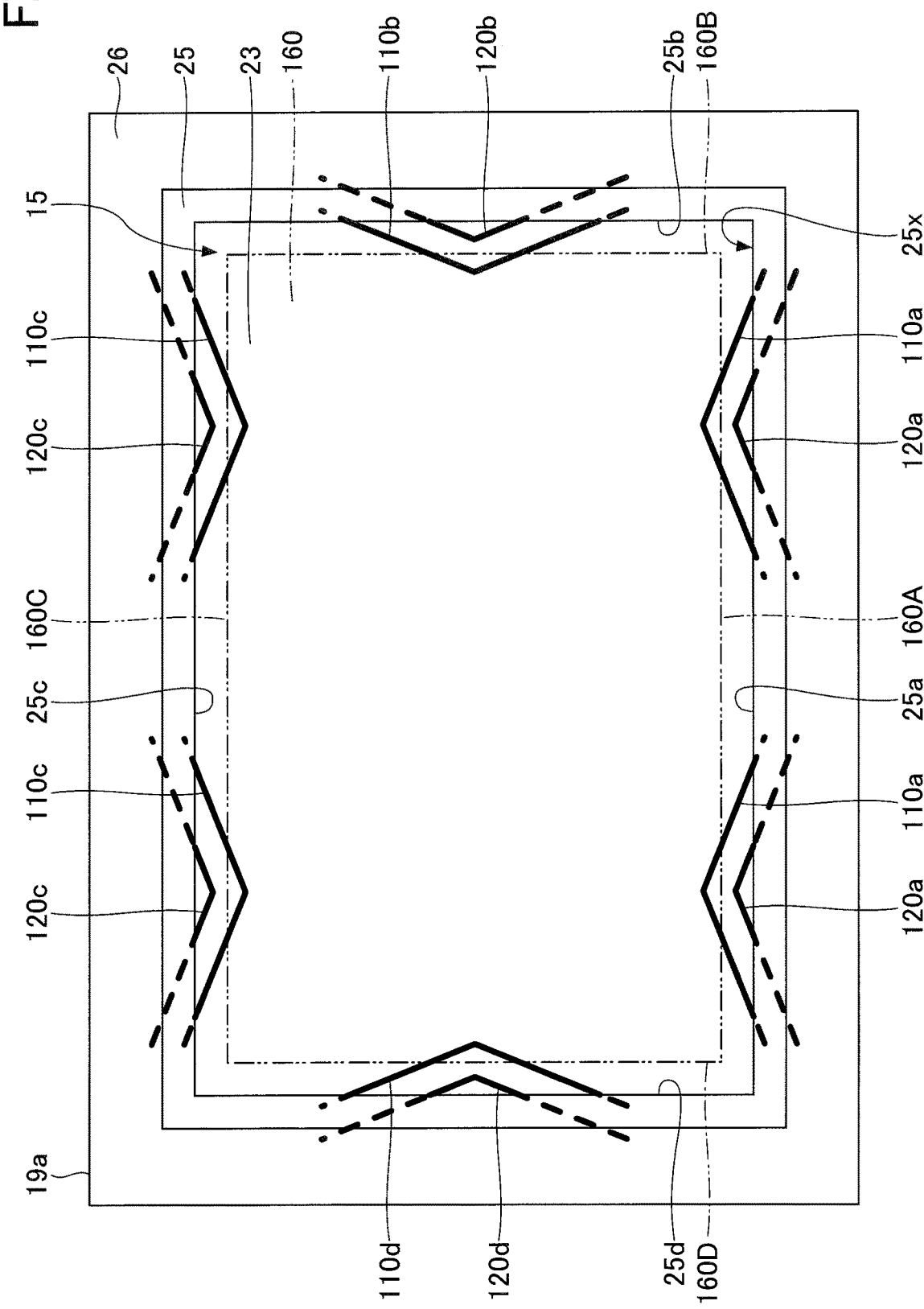
FIG. 20 is a diagram illustrating a change in the exposure state of the reference patterns in the method of manufacturing the substrate with built-in component according to the first embodiment (part 3)

Next, as illustrated in FIG. 10, in the insulating layer 26, the wiring layer 25, and the insulating layer 24, a cavity 15 is formed to penetrate the insulating layer 26, the wiring layer 25, and the insulating layer 24 and to expose one surface of the wiring layer 23. The cavity 15 can by be formed, for example, by a laser processing method using a $CO_2$ laser or the like while adjusting the position with an alignment mark formed in advance on the wiring layer 25. After forming the cavity 15, as illustrated in FIG. 20, the opening pattern 25x is exposed from the insulating layer 26 and a portion of the wiring layer 23 is exposed from the opening pattern 25x.

Also, the side surface 25a of the opening pattern 25x crosses the reference patterns 120a, the side surface 25b of the opening pattern 25x crosses the reference pattern 120b, the side surface 25c of the opening pattern 25x crosses the reference patterns 120c, and the side surface 25d of the opening pattern 25x crosses the reference pattern 120d. When the cavity 15 is formed as designed, the side surface 25a of the opening pattern 25x overlaps the side 115A of the cavity forming area 115, the side surface 25b of the opening pattern 25x overlaps the side 115B of the cavity forming area 115, the side surface 25c of the opening pattern 25x overlaps the side 115C of the cavity forming area 115, and the side surface 25d of the opening pattern 25x overlaps the side 115D of the cavity forming area 115.

Figure 11:
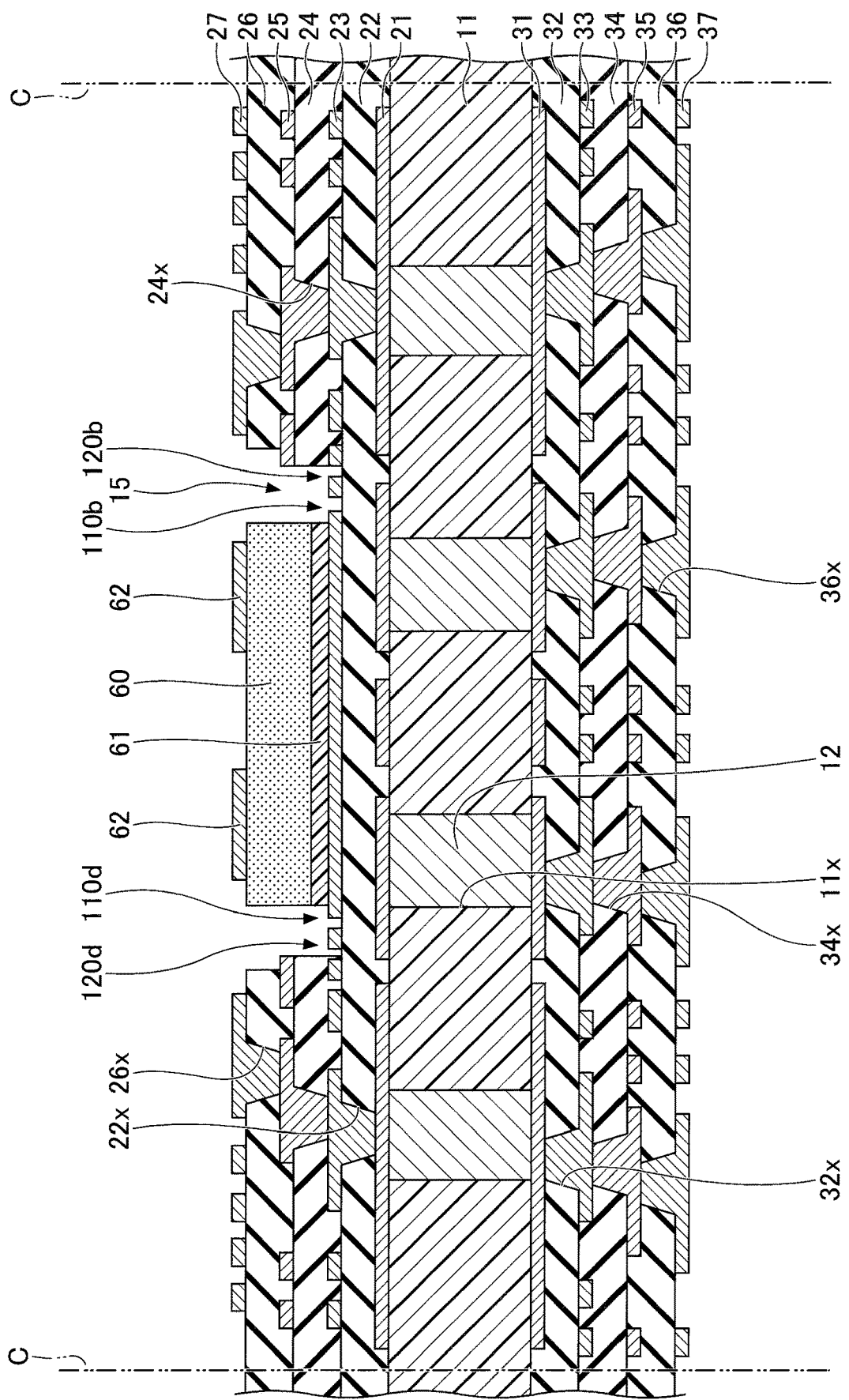
FIG. 11 is a cross-sectional view illustrating a step of the method of manufacturing the substrate with built-in component according to the first embodiment (part 7)
Figure 21:
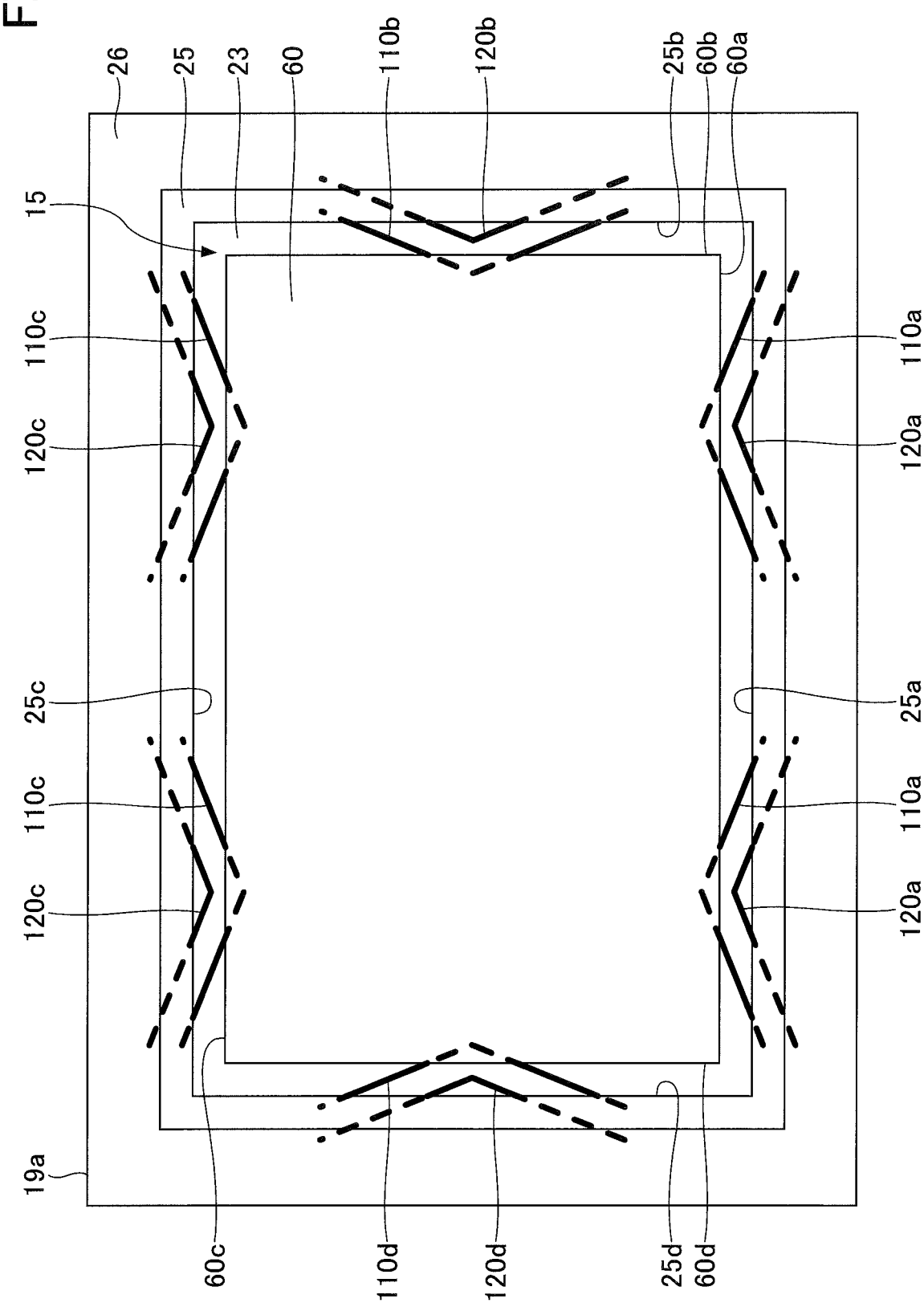
FIG. 21 is a diagram illustrating a change in the exposure state of the reference patterns in the method of manufacturing the substrate with built-in component according to the first embodiment (part 1)

Next, as illustrated in FIG. 11, in the cavity 15, the electronic component 60 having electrode pads 62 on one side is mounted on the one surface of the wiring layer 23 via an adhesive 61. For example, the electronic component 60 is mounted on the one surface of the wiring layer 23 while adjusting the position using an alignment mark formed in advance on the wiring layer 25 and an alignment mark formed in advance on the electronic component 60. After mounting the electronic component 60, a portion of the wiring layer 23 is exposed from the electronic component 60, as illustrated in FIG. 21.

Also, in plan view, the side surface 60a of the electronic component 60 crosses the reference patterns 110a, the side surface 60b of the electronic component 60 crosses the reference pattern 110b, the side surface 60c of the electronic component 60 crosses the reference patterns 110c, and the side surface 60d of the electronic component 60 crosses the reference pattern 110d. When the electronic component 60 is mounted as designed, in plan view, the side surface 60a of the electronic component 60 overlaps the side 160A of the component mounting area 160, the side surface 60b of the electronic component 60 overlaps the side 160B of the component mounting area 160, the side surface 60c of the electronic component 60 overlaps the side 160C of the component mounting area 160, and the side surface 60d of the electronic component 60 overlaps the side 160D of the component mounting area 160.

Figure 22:
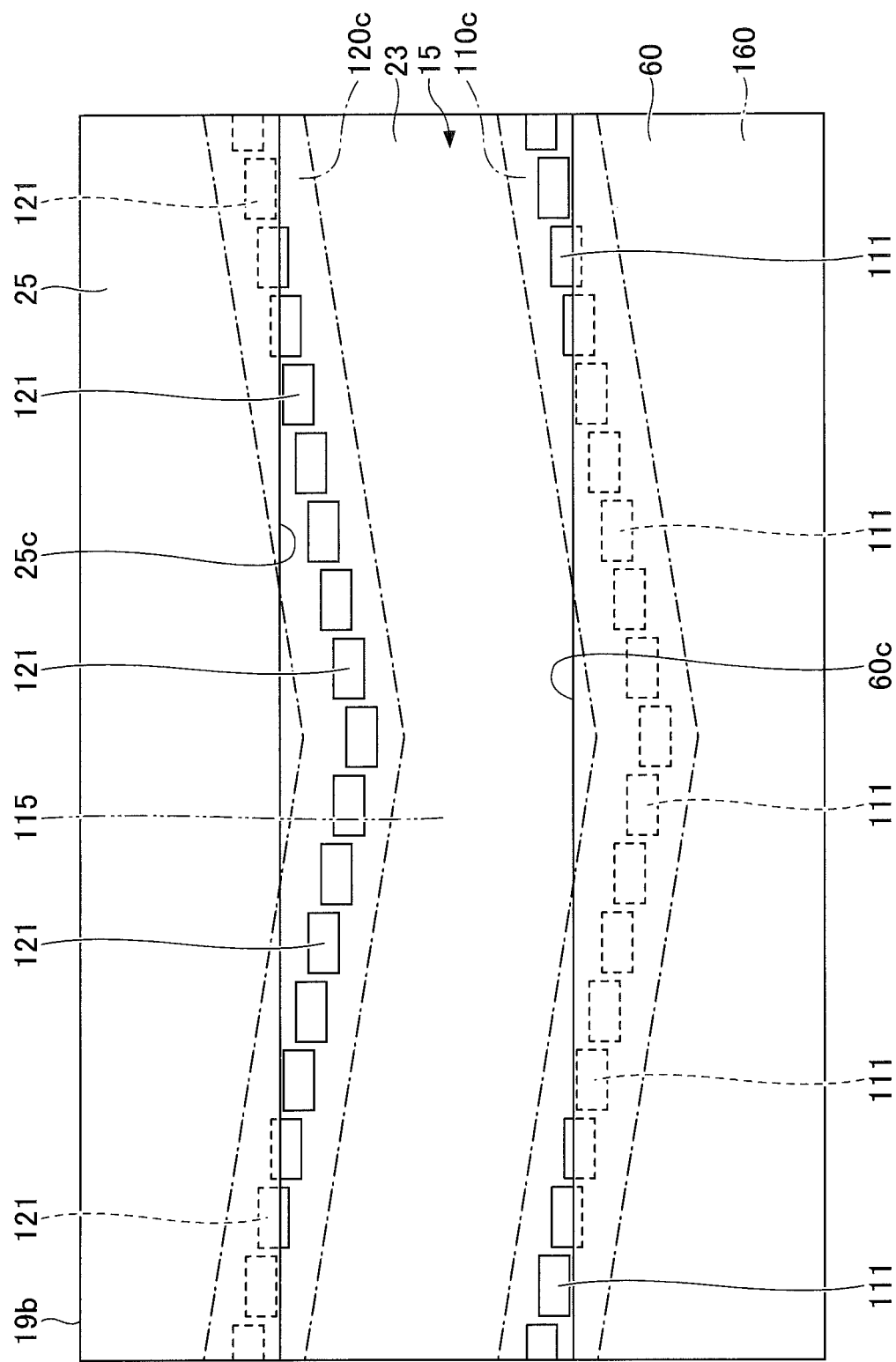
FIG. 22 is a diagram illustrating a positional relationship between the wiring layers, the cavity, and the electronic component in a first state.
Figure 23:
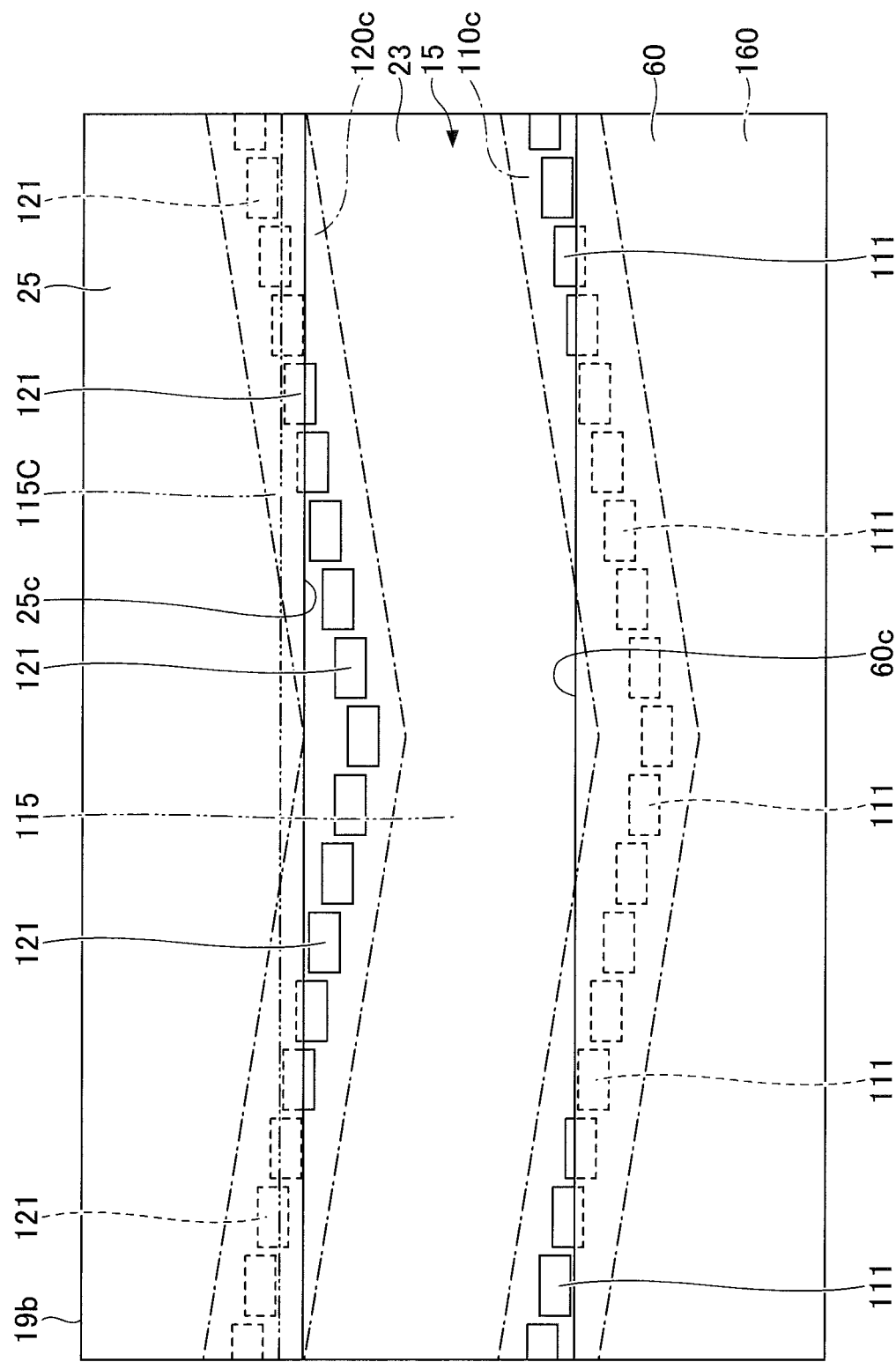
FIG. 23 is a diagram illustrating a positional relationship between the wiring layers, the cavity, and the electronic component in a second state.
Figure 24:
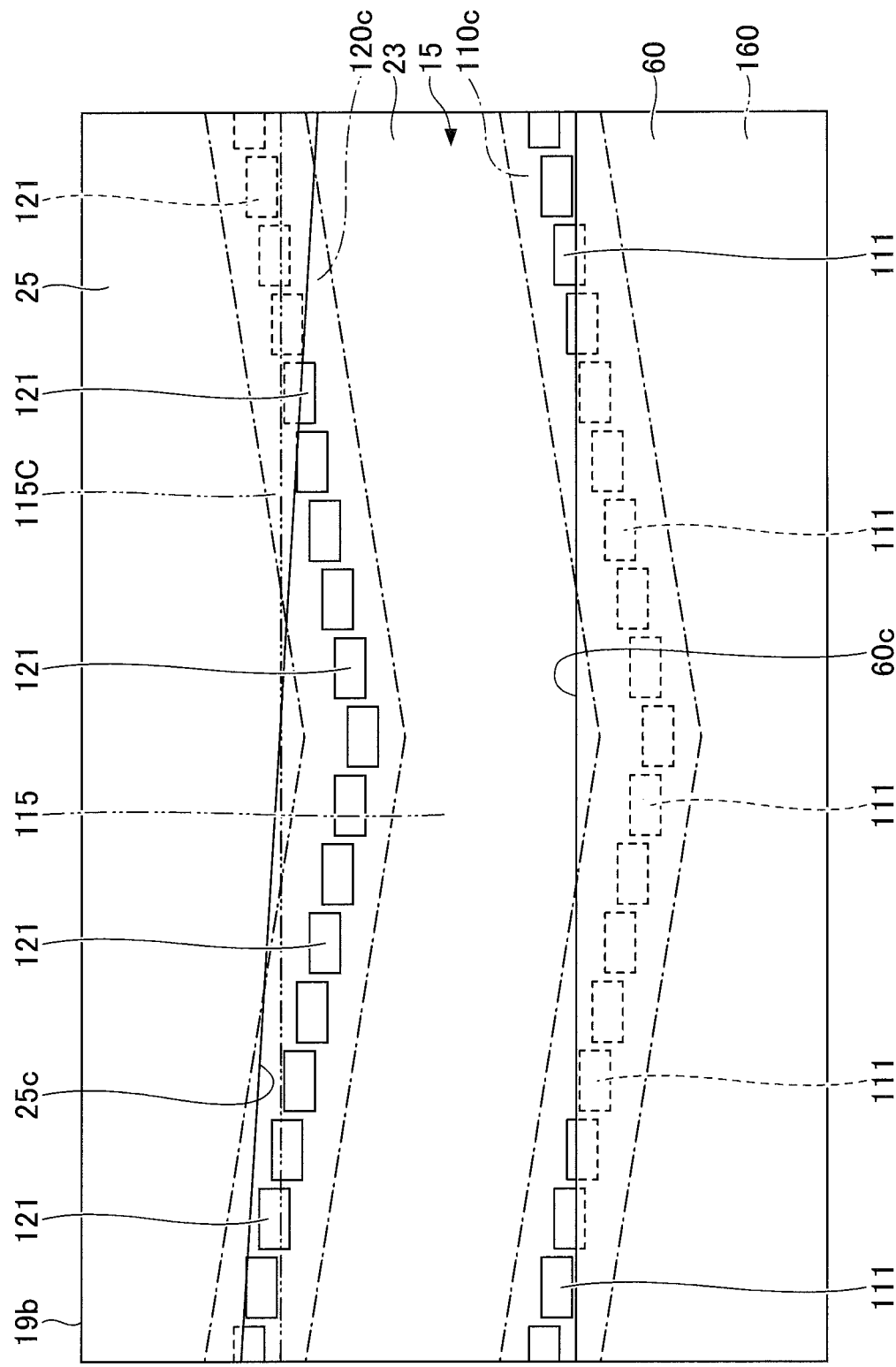
FIG. 24 is a diagram illustrating a positional relationship between the wiring layers, the cavity, and the electronic component in a third state.
Figure 25:
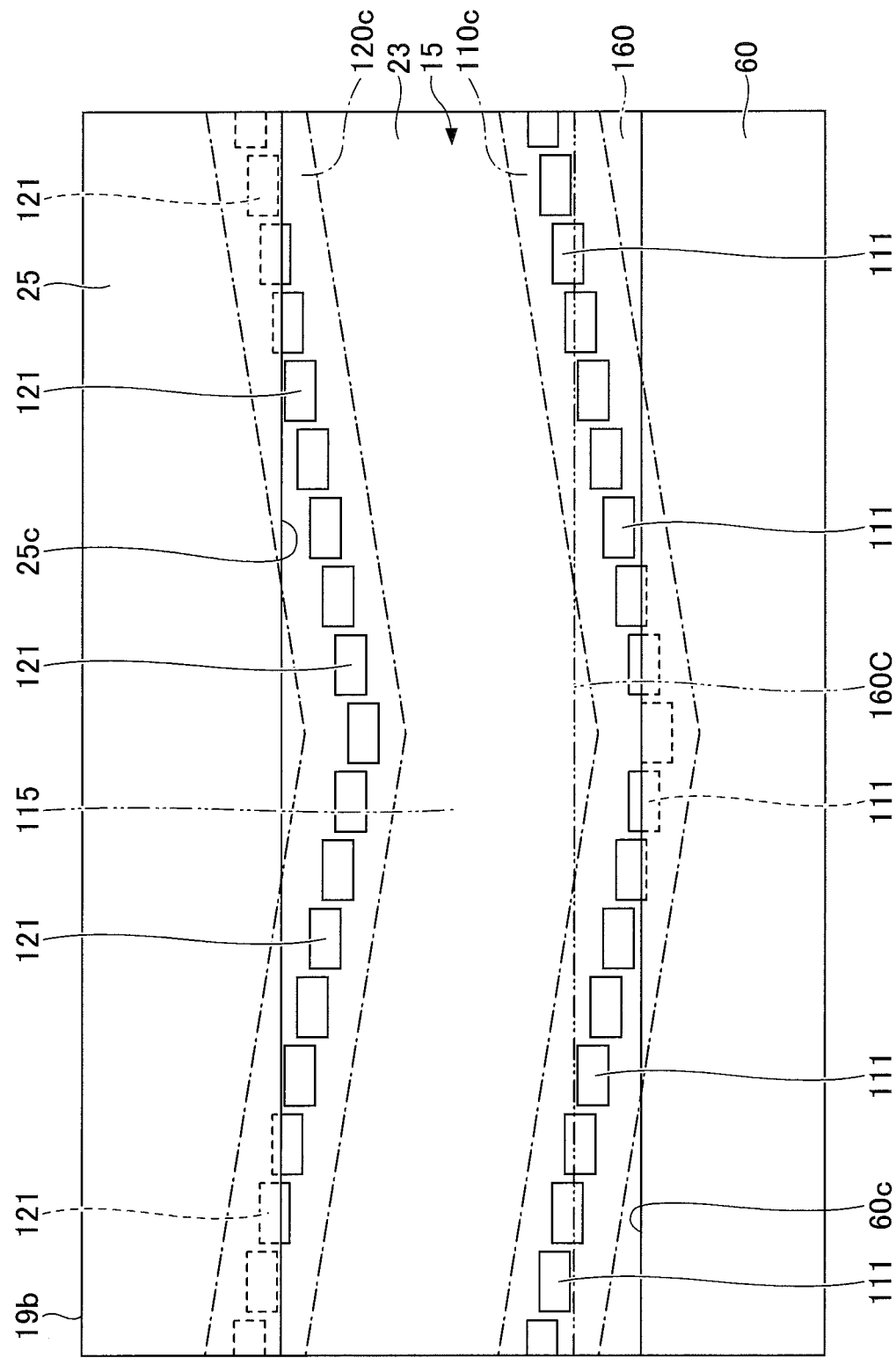
FIG. 25 is a diagram illustrating a positional relationship between the wiring layers, the cavity, and the electronic component in a fourth state.
Figure 26:
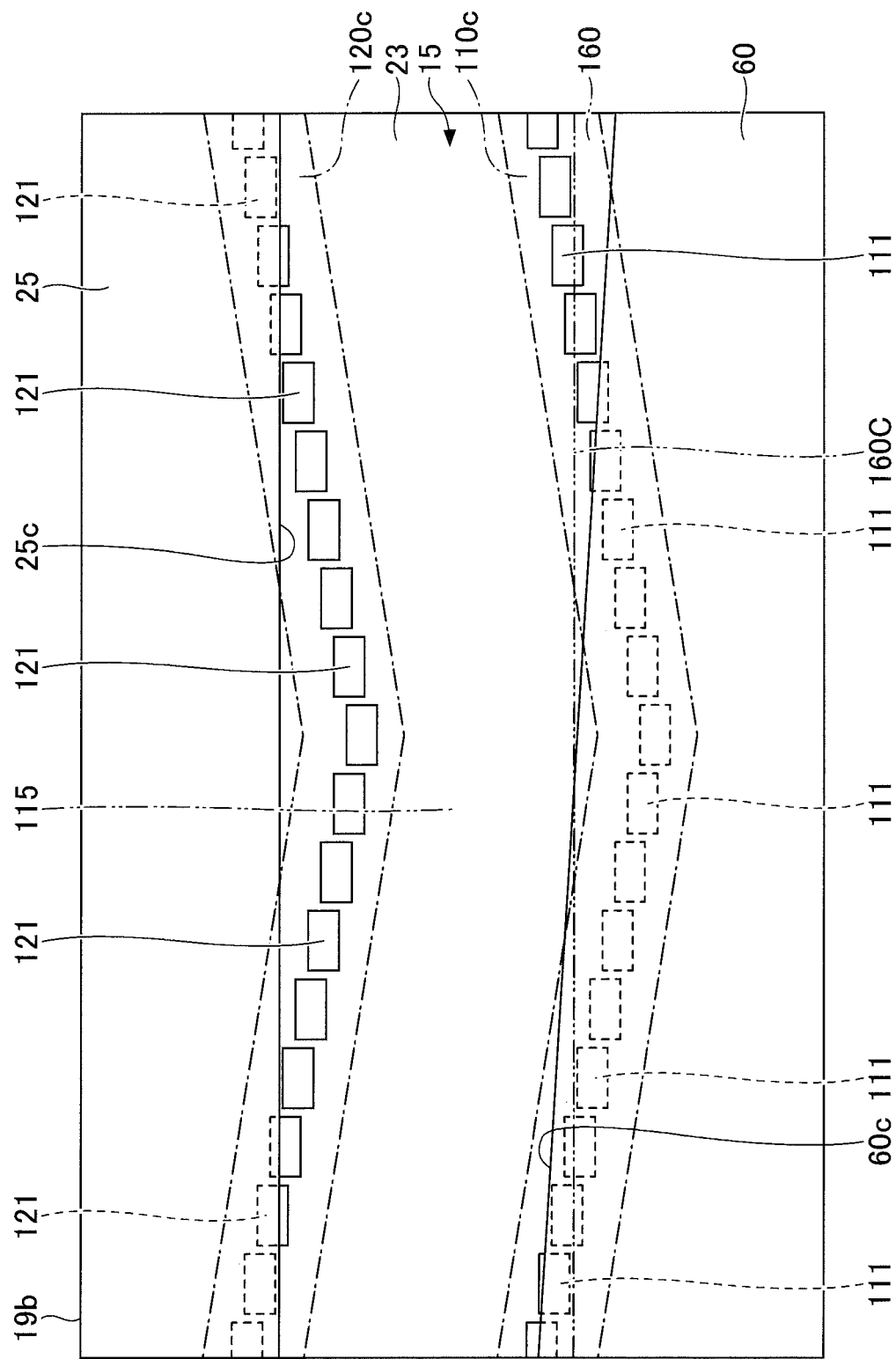
FIG. 26 is a diagram illustrating a positional relationship between the wiring layers, the cavity, and the electronic component in a fifth state.

After mounting the electronic component 60, the positional accuracy of the cavity 15 and the electronic component 60 is checked. In the following, a method of checking the positional accuracy of the cavity 15 and the electronic component 60 will be described with reference to specific states of the cavity 15 and the electronic component 60. FIG. 22 is a diagram illustrating a positional relationship between the wiring layers 23 and 25, the cavity 15, and the electronic component 60 in a first state where the cavity 15 is formed as designed and the electronic component 60 is mounted as designed. FIG. 23 is a diagram illustrating a positional relationship between the wiring layers 23 and 25, the cavity 15, and the electronic component 60 in a second state where the electronic component 60 is mounted as designed and the cavity 15 is displaced in a translational direction. FIG. 24 is a diagram illustrating a positional relationship between the wiring layers 23 and 25, the cavity 15, and the electronic component 60 in a third state where the electronic component 60 is mounted as designed and the cavity 15 is displaced in a rotational direction. FIG. 25 is a diagram illustrating the positional relationship between the wiring layers 23 and 25, the cavity 15, and the electronic component 60 in a fourth state where the cavity 15 is formed as designed and the electronic component 60 is displaced in a translational direction. FIG. 26 is a diagram illustrating the positional relationship between the wiring layers 23 and 25, the cavity 15, and the electronic component 60 in a fifth state where the cavity 15 is formed as designed and the electronic component 60 is displaced in a rotational direction.

For example, a microscope is used to specify slits 121 that the side surfaces 25a to 25d of the opening pattern 25x traverse in the respective reference patterns 120a to 120d. When the cavity 15 is formed as designed (in the first state), as illustrated in FIG. 22, the side surface 25c traverses the slits 121 at 44th and 45th from both ends within the reference pattern 120c in plan view. Because the slits 121 are formed such that slits 121 to be traversed are the slits 121 at 44th and 45th from both ends when the cavity 15 is formed as designed, it can be specified from this observation result that cavity 15 is formed as designed.

With respect to above, when the formed cavity 15 is displaced in a translational direction (in the second state), as illustrated in FIG. 23, the side surface 25c traverses slits 121, which are different from the combination of the slits 121 at 44th and 45th from both ends within the reference pattern 120c in plan view. In the example illustrated in FIG. 23, the side surface 25c traverses the combination of the slits 121 at 46th and 47th from both ends in the reference pattern 120c. From this observation result, it can be specified that the formed cavity 15 is displaced by the amount corresponding to two slits 121 in the translational direction perpendicular to the side 115C. Also, because the interval of slits 121 in the direction of the displacement is 1 μm, it can be specified that that the amount of the displacement is 2 μm.

Also, when the formed cavity 15 is displaced in a rotational direction (in the third state), as illustrated in FIG. 24, the side surface 25c traverses slits 121, which are different from the combination of the slits 121 at 42th and 43th from both ends within the reference pattern 120c in plan view. In the example illustrated in FIG. 24, the side surface 25c traverses, in the reference pattern 120c, the combination of 44th and 45th from one end and the combination of 46th and 47th from the other end. From this observation result, it can be specified that the formed cavity 15 is displaced in the rotational direction. The rotational angle can also be easily calculated from the interval in the direction parallel to the side 115C and the interval in the direction perpendicular to the side 115C of the slits 121.

By performing similar observations on the side surfaces 25a, 25b, and 25d of the opening pattern 25x, the positional accuracy in the translational direction and the rotational direction of the cavity 15 can be specified.

Also, for example, a microscope is used to specify slits 111 that the side surfaces 60a to 60d of the electronic component 60 traverse in the respective reference patterns 110a to 110d. When the electronic component 60 is mounted as designed (in the first state), as illustrated in FIG. 22, the side surface 60c traverses the slits 111 at 44th and 45th from both ends within the reference pattern 110c in plan view. Because the slits 111 are formed such that slits 111 to be traversed are the slits 111 at 44th and 45th from both ends when the electronic component 60 is formed as designed, it can be specified from this observation result that the electronic component 60 is mounted as designed.

With respect to above, when the formed electronic component 60 is displaced in a translational direction (in the fourth state), as illustrated in FIG. 25, the side surface 60c traverses slits 111, which are different from the combination of the slits 111 at 44th and 45th from both ends within the reference pattern 110c in plan view. In the example illustrated in FIG. 25, the side surface 60c traverses the combination of the slits 111 at 49th and 50th from both ends in the reference pattern 110c. From this observation result, it can be specified that the mounted electronic component 60 is displaced by the amount corresponding to five slits 111 in the translational direction perpendicular to the side 160C. Also, because the interval of slits 111 in the direction of the displacement is 1 μm, it can be specified that that the amount of the displacement is 5 μm.

Also, when the formed electronic component 60 is displaced in a rotational direction (in the fifth state), as illustrated in FIG. 26, the side surface 60c traverses slits 111, which are different from the combination of the slits 111 at 44th and 45th from both ends within the reference pattern 110c in plan view. In the example illustrated in FIG. 26, the side surface 60c traverses, in the reference pattern 120c, the combination at 42th and 43th from the one end and the combination at 46th and 47th from the other end. From this observation result, it can be confirmed that the formed electronic component 60 is displaced in the rotational direction. The rotational angle can also be easily calculated from the interval in the direction parallel to the side 160C and the interval in the direction perpendicular to the side 160C of the slits 111.

By performing similar observations on the side surfaces 60a, 60b, and 60d of the electronic component 60, the positional accuracy in the translational direction and the rotational direction of the electronic component 60 can be specified.

In addition, the distance between the side surface 60a and the side surface 25a can be specified from the number of slits 111 exposed between the side surface 60a and the side surface 25a. Similarly, the distance between the side surface 60b and the side surface 25b can be specified from the number of slits 111 exposed between the side surface 60b and the side surface 25b, the distance between the side surface 60c and the side surface 25c can be specified from the number of slits 111 exposed between the side surface 60c and the side surface 25c, and the distance between the side surface 60d and the side surface 25d can be specified from the number of slits 111 exposed between the side surface 60d and the side surface 25d.

Figure 12:
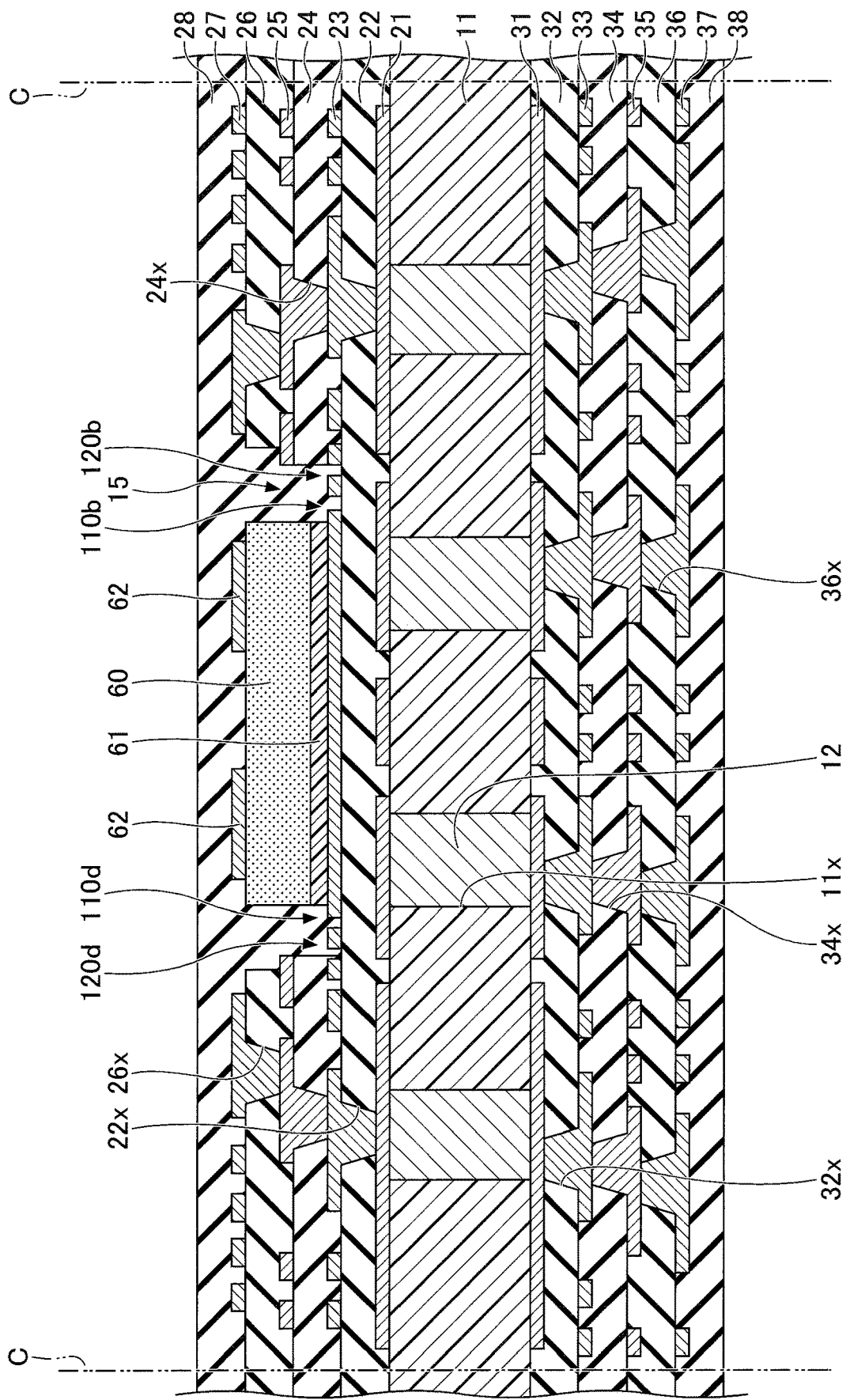
FIG. 12 is a cross-sectional view illustrating a step of the method of manufacturing the substrate with built-in component according to the first embodiment (part 8)

After checking the positional accuracy of the cavity 15 and the electronic component 60, as illustrated in FIG. 12, on the one surface of the insulating layer 26, an insulating resin film, such as a film-like epoxy-based resin is laminated to fill the cavity 15 and so as to cover the wiring layer 27 and the electronic component 60 such that the insulating layer 28 is formed. Also, an insulating resin film, such as a film-like epoxy-based resin, is laminated on the other surface of the insulating layer 36 so as to cover the wiring layer 37 such that the insulating layer 38 is formed. Alternatively, instead of laminating a film-like epoxy-based resin, an insulating resin, such as a liquid or paste epoxy-based resin, may be applied and then be cured to form the insulating layers 28 and 38. The thickness of the insulating layer 28 on the insulating layer 26 can be, for example, approximately 15 μm to 70 μm. The thickness of the insulating layer 38 can be, for example, approximately 30 μm to 70 μm. Also, each of the insulating layers 28 and 38 may include a filler such as silica ($SiO_2$). A portion of the insulating layer 28 also enters the cavity 15. Therefore, even when the thickness of the insulating resin film used to form the insulating layer 28 is the same as the thickness of the insulating resin film used to form the insulating layer 22, the thickness of the insulating layer 28 on the insulating layer 26 may be thinner than the thickness of the insulating layer 22.

Figure 13:
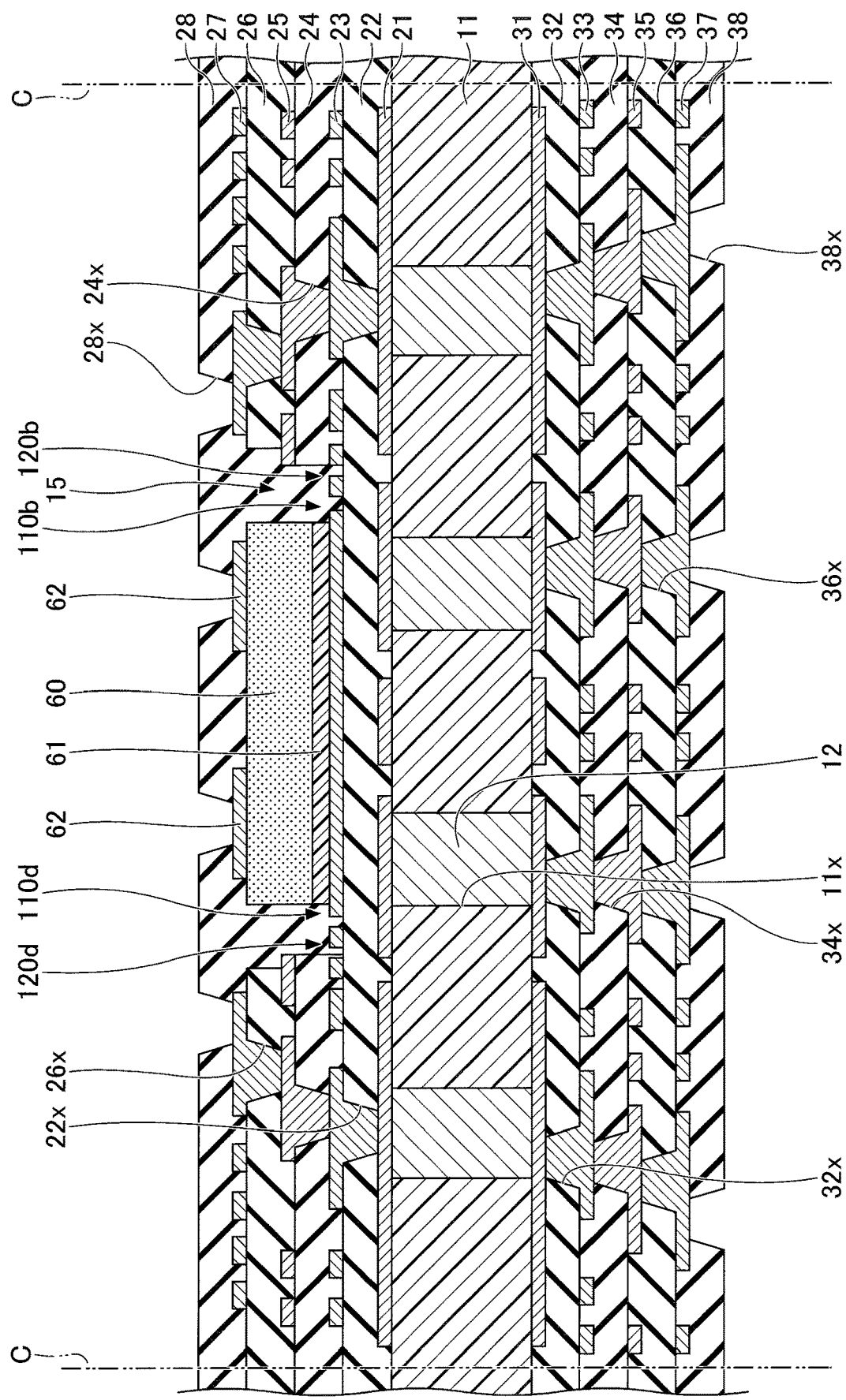
FIG. 13 is a cross-sectional view illustrating a step of the method of manufacturing the substrate with built-in component according to the first embodiment (part 9)

Next, as illustrated in FIG. 13, in the insulating layer 28, via holes 28x that penetrate the insulating layer 28 and expose one surface of the wiring layer 27 and the electrode pads 62 of the electronic component 60 are formed. Also, in the insulating layer 38, via holes 38x that penetrate the insulating layer 38 and expose the other surface of the wiring layer 37 are formed. The via holes 28x and 38x can be formed, for example, by laser processing using a $CO_2$ laser or the like. It is preferable that after the via holes 28x and 38x are formed, a desmear process is performed to remove resin residue adhered on the surface of the electrode pads 62 and the wiring layer 27 exposed at the bottom portions of the via holes 28x and to remove resin residue adhered on the surface of the wiring layer 37 exposed at the bottom portions of the via holes 38x.

Figure 14:
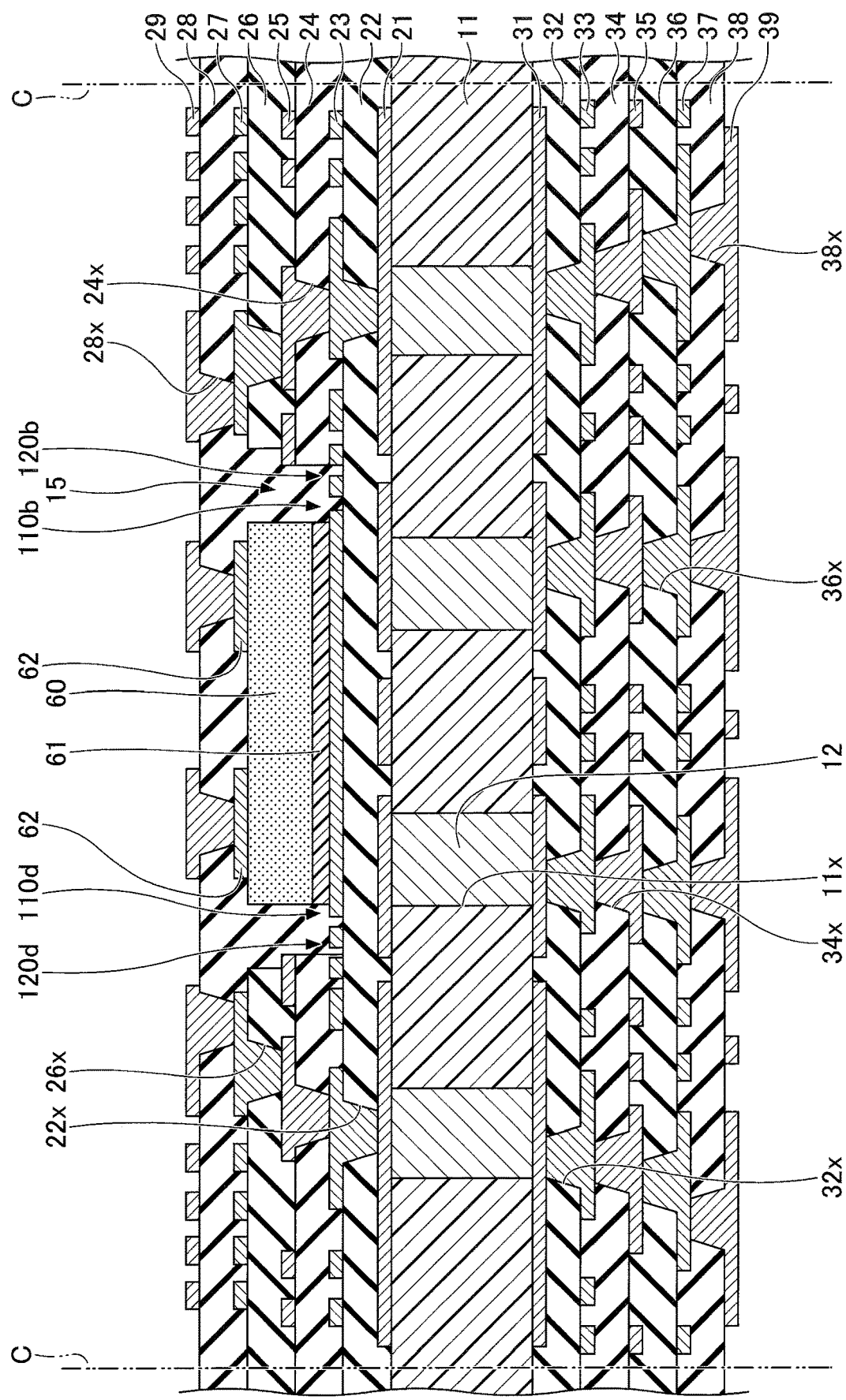
FIG. 14 is a cross-sectional view illustrating a step of the method of manufacturing the substrate with built-in component according to the first embodiment (part 10)

Next, as illustrated in FIG. 14, the wiring layer 29 is formed on the one side of the insulating layer 28. The wiring layer 29 is configured to include via wirings filling the via holes 28x and include a wiring pattern formed on the one surface of the insulating layer 28. The wiring layer 29 is electrically connected to the electrode pad as 62 and the wiring layer 27 exposed at the bottom portions of the via holes 28x.

Similarly, the wiring layer 39 is formed on the other side of the insulating layer 38. The wiring layer 39 is configured to include via wirings filling the via holes 38x and include a wiring pattern formed on the other surface of the insulating layer 38. The wiring layer 39 is electrically connected to the wiring layer 37 exposed at the bottom portions of the via holes 38x.

Figure 15:
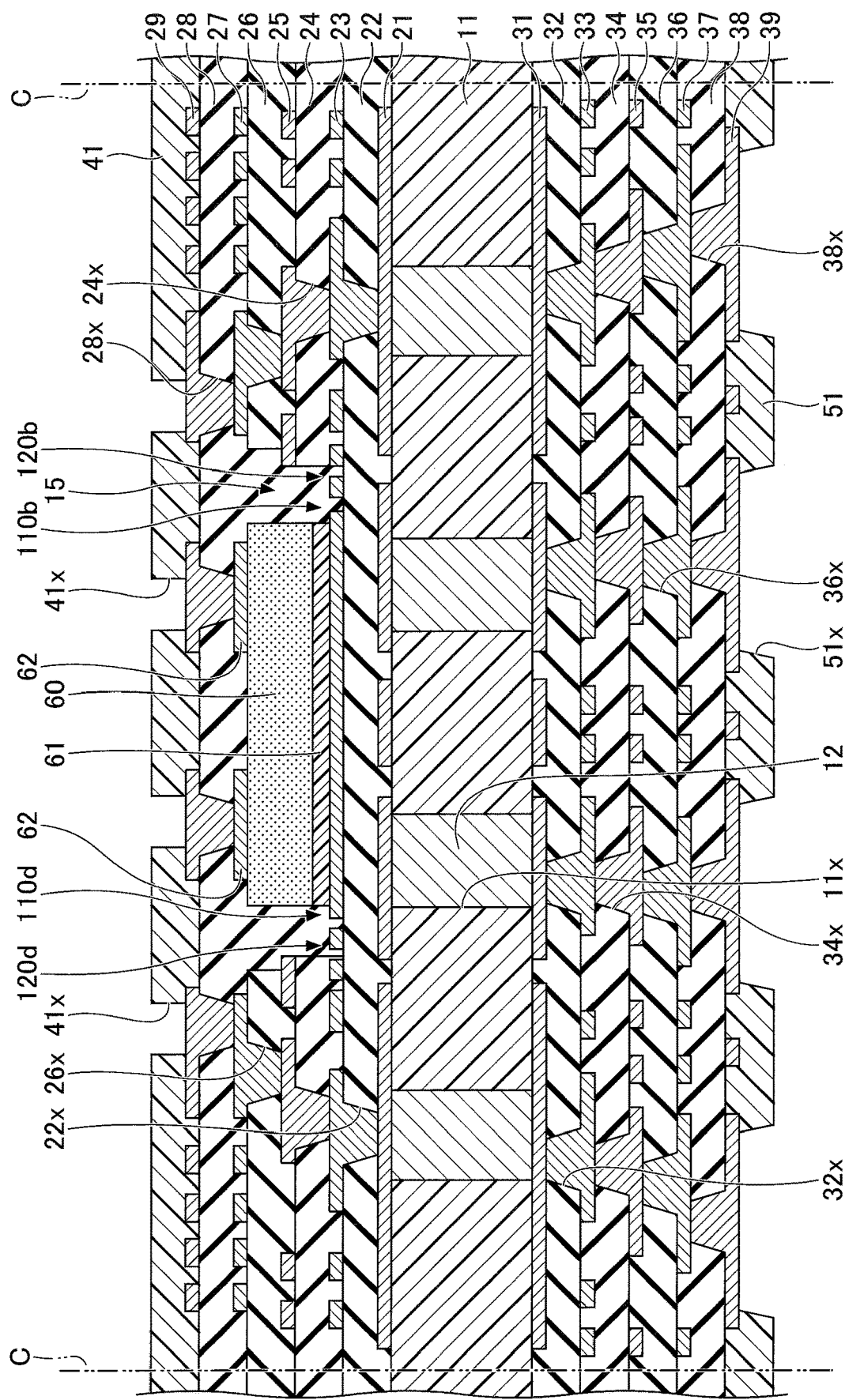
FIG. 15 is a cross-sectional view illustrating a step of the method of manufacturing the substrate with built-in component according to the first embodiment (part 11)

Next, as illustrated in FIG. 15, the solder resist layer 41 is formed on the one surface of the insulating layer 28 to cover the wiring layer 29. It should be noted that the solder resist layer 41 may be provided to completely expose the wiring layer 29. The solder resist layer 41 may be formed by applying, for example, a liquid or paste photosensitive epoxy-based insulating resin to one surface of the insulating layer 28 so as to cover the wiring layer 29 by a screen printing method, a roll coating method, a spin coating method, or the like. Alternatively, for example, the solder resist layer 41 may be formed by laminating a film-like photosensitive epoxy-based insulating resin on one surface of the insulating layer 28 so as to cover the wiring layer 29. Similarly, the solder resist layer 51 is formed on the other surface of the insulating layer 38 to cover the wiring layer 39.

Then, by exposing and developing the applied or laminated insulating resin, opening portions 41x are formed in the solder resist layer 41 (photolithography method). Also, opening portions 51x are formed in the solder resist layer 51 (photolithography method). The opening portions 41x and 51x may be formed by a laser processing method or a blasting process. The planar shape of each of the opening portions 41x and 51x can be, for example, circular. The diameter of each of the opening portions 41x and 51x can be designed as suited in accordance with, for example, a terminal pitch of a semiconductor chip or motherboard.

If necessary, a metal layer or the like may be formed on the one surface of the wiring layer 29 (first pads 29) and the other surface of the wiring layer 39 (second pads) exposed at the respective bottom portions of the opening portions 41x and 51x, for example, by electroless plating or the like. Examples of the metal layer include an Au layer, a Ni/Au layer (a metal layer made by layering a Ni layer and an Au layer in this order), a Ni/Pd/Au layer (a metal layer made by layering a Ni layer, a Pd layer, and an Au layer in this order), and the like. Also, instead of forming a metal layer, an antioxidant treatment such as an OSP (Organic Solderability Preservative) treatment may be applied to the one surface of the wiring layer 29 and the other surface of the wiring layer 39 exposed at the respective bottom portions of the opening portions 41x and 51x.

Figure 16:
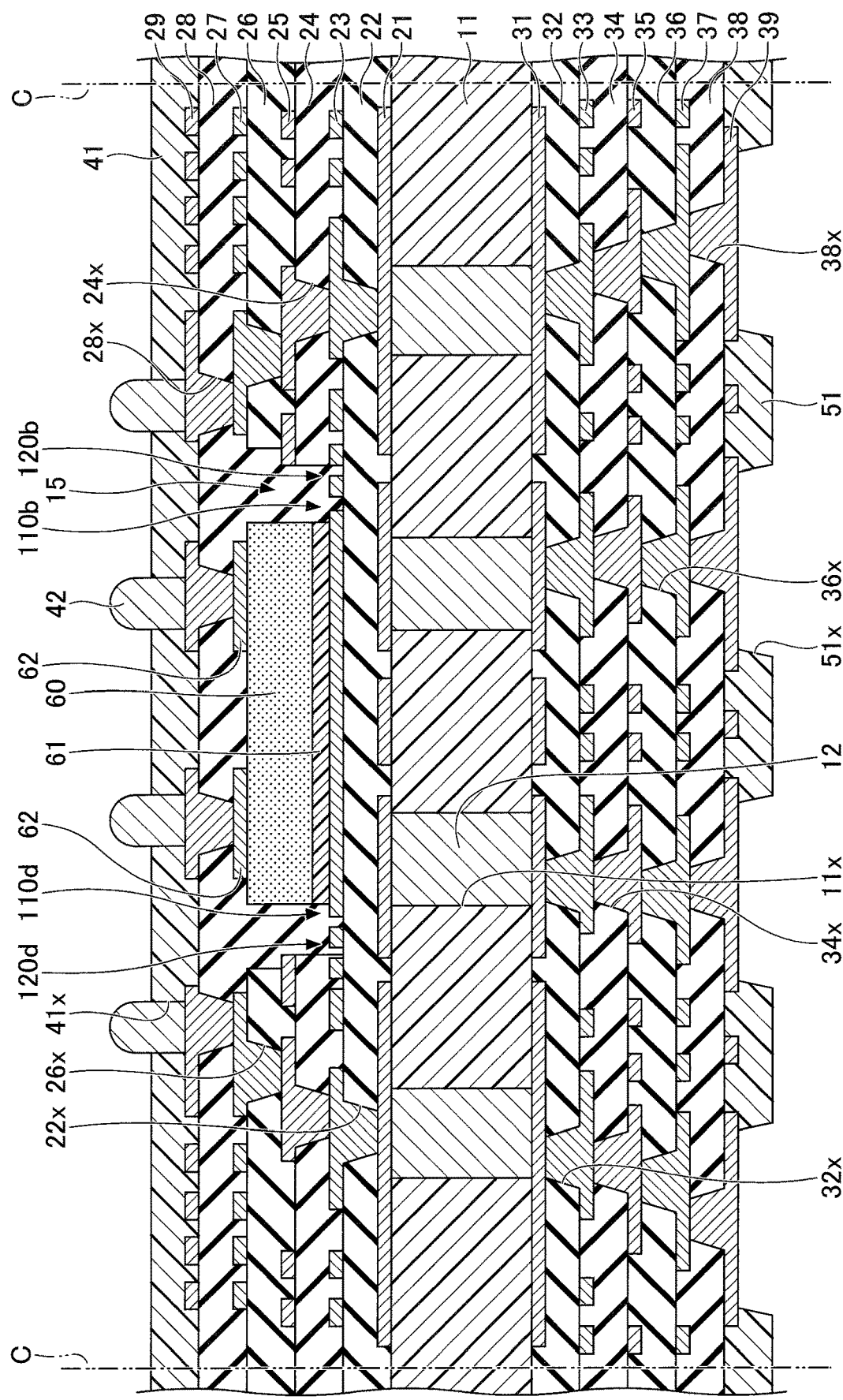
FIG. 16 is a cross-sectional view illustrating a step of the method of manufacturing the substrate with built-in component according to the first embodiment (part 12)

Next, as illustrated in FIG. 16, the external connection terminals 42 are formed on the first pads 29, or on the metal layer or the like in a case in which the metal layer or the like is formed on the first pads 29. For example, a solder ball or the like may be used as the external connection terminals 42. As the material of the solder ball, for example, an alloy containing Pb, an alloy of Sn and Cu, an alloy of Sn and Sb, an alloy of Sn and Ag, an alloy of Sn, Ag, and Cu, or the like can be used.

In an example of a method of forming the external connection terminals 42, for example, in a case where a metal layer or the like is formed on the first pads 29, flux as a surface treating agent is first applied to the metal layer or the like. Solder balls are then mounted and reflowed at a temperature of approximately 240° C. to 260° C. The surface is then washed to remove the flux. In this manner, the external connection terminals 42 can be formed.

Figure 17:
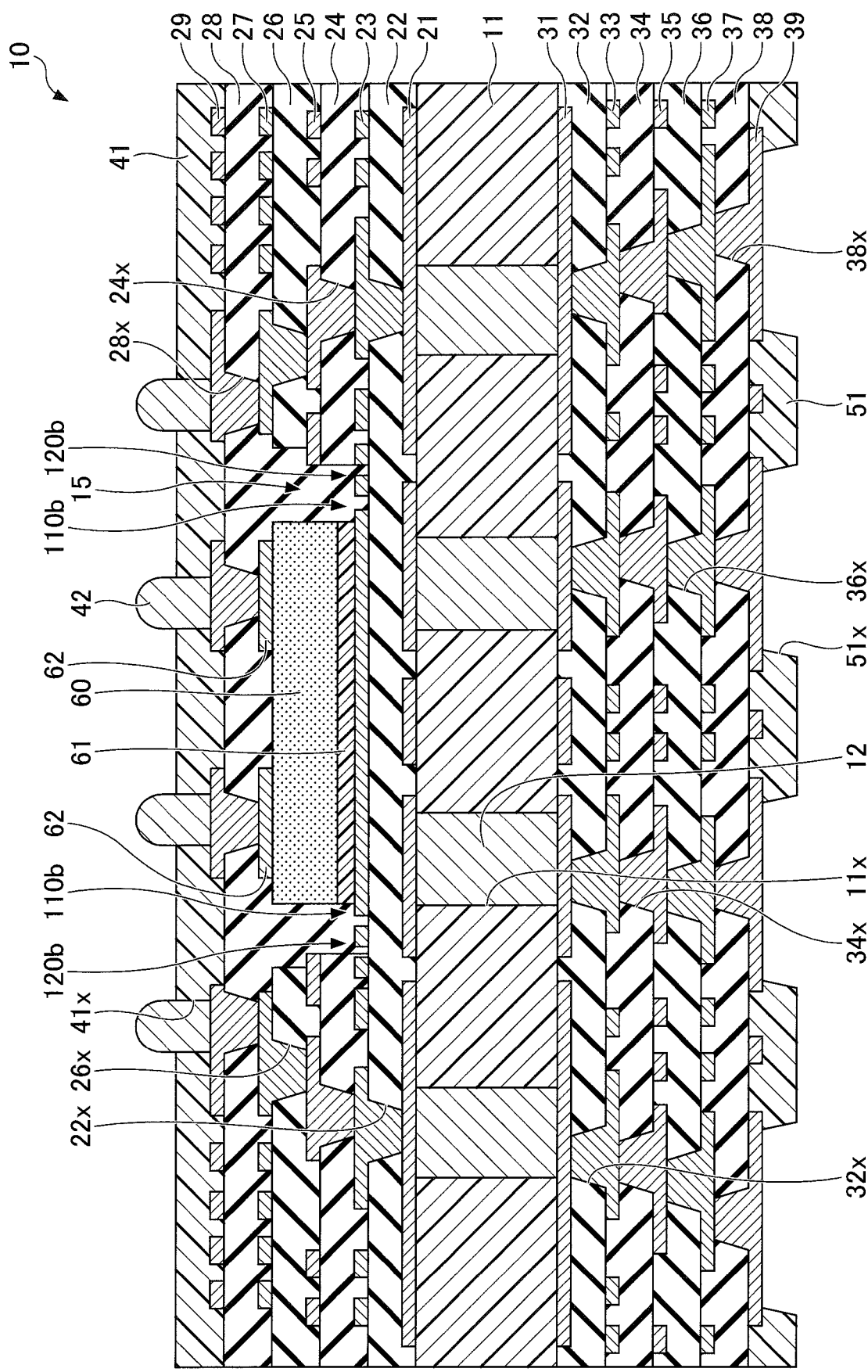
FIG. 17 is a cross-sectional view illustrating a step of the method of manufacturing the substrate with built-in component according to the first embodiment (part 13)

After the external connection terminals 42 are formed, the substrate with built-in component 10 is cut to be separated along the cut lines C, as illustrated in FIG. 17. The substrate with built-in component 10 is separated by cutting with a slicer or the like along the cut lines C.

In this manner, the substrate with built-in component 10 according to the first embodiment can be manufactured. It should be noted that the separation of the substrate with built-in component 10 may be performed after the step illustrated in FIG. 15 without forming the external connection terminals 42. That is, the substrate with built-in component 10 may not include external connection terminals 42.

According to a method as described above, using the reference patterns 110a to 110d and 120a to 120d of the wiring layer 23, the positional accuracy of the cavity 15 and electronic component 60 can be easily checked. Then, the substrate with built-in component 10 can be manufactured while easily checking the positional accuracy of the cavity 15 and the electronic component 60.

Also, in the present embodiment, in plan view, two types of reference patterns are provided to be arranged in a direction perpendicular to each side surface of the electronic component 60. For example, the reference patterns 110a and 120a are provided to be arranged in a direction perpendicular to the side surface 60A. Therefore, in a case of observation using a microscope, it is easy to check the positional accuracy of the cavity 15 and the electronic component 60 in one field of view.

Further, in the present embodiment, in plan view, the reference patterns 110a to 110d cross, at two or more locations, the respective side surfaces 60a to 60d of the electronic component 60. Accordingly, the positional accuracy of the rotational direction of the electronic component 60 can be specified.

It should be noted that the reference patterns 110a to 110d may cross, at one location, the respective side surfaces 60a to 60d of the electronic component 60. Even in this case, positional accuracy in at least the translational direction can be specified. In this case, it is preferable that characteristic slits 112 are included as in a modified example which will be described later.

In a case in which a predetermined standard is not satisfied as a result of checking the positional accuracy of the cavity 15 and the electronic component 60, subsequent steps may be omitted. In this case, the manufacturing of the substrate with built-in component 10 may be newly started after adjusting a laser device or the like used to form the cavity 15 or after adjusting a device or the like used to mount the electronic component 60.

The frequency of checking the positional accuracy of the cavity 15 and the electronic component 60 is not particularly limited. For example, it may be performed for each manufacturing of the substrate with built-in component 10, or it may be performed only at the beginning of the lot in a case of lot production.

The method of checking the positional accuracy of the cavity 15 and the electronic component 60 is not limited to the method of using a microscope. For example, an image may be acquired by an imaging device, such as a camera, and the positional accuracy may be checked by image processing of the acquired image with reference to the reference patterns 120a to 120d or 110a to 110d.

Second Embodiment

Figure 27:
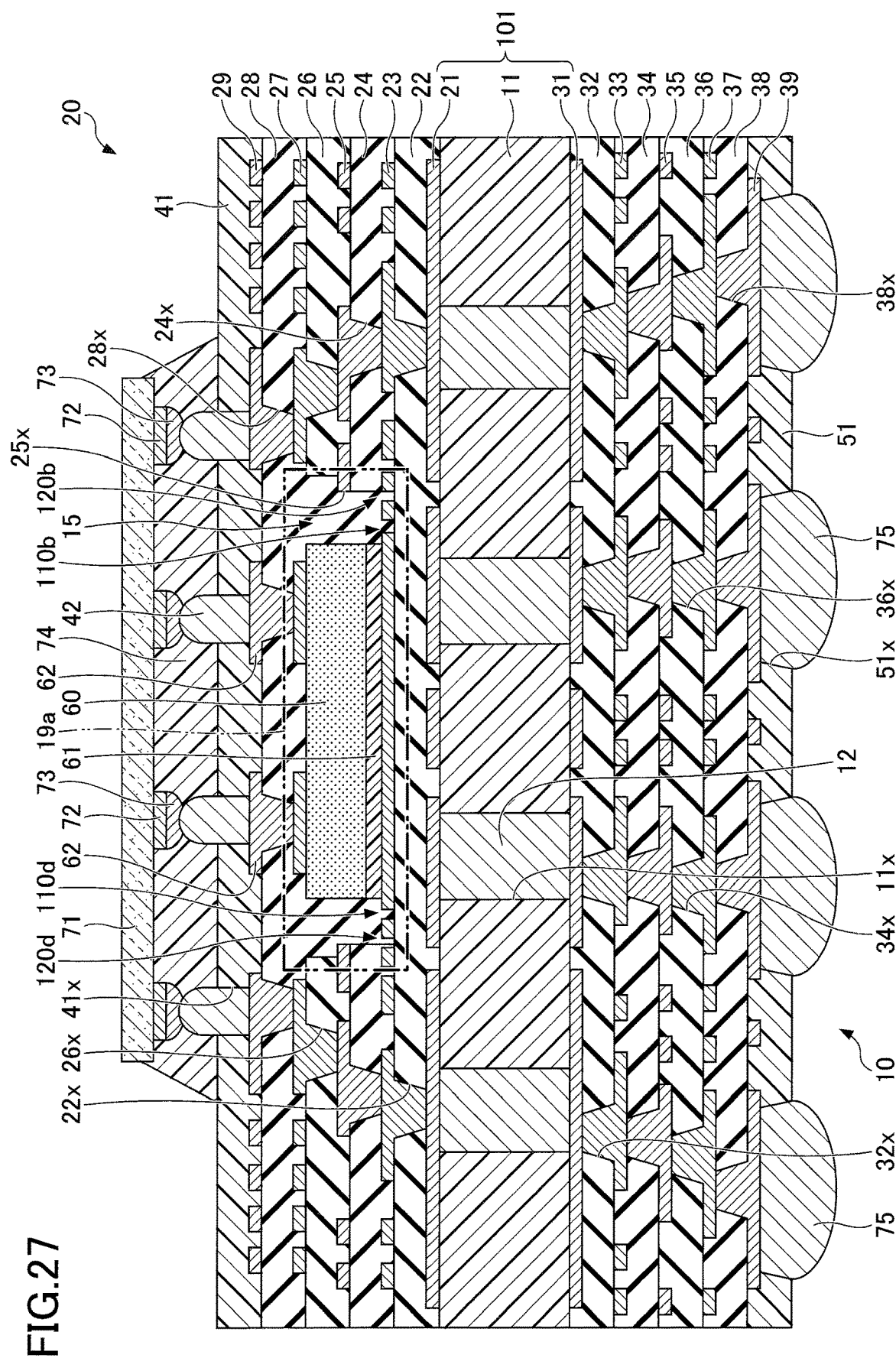
FIG. 27 is a cross-sectional view illustrating a semiconductor package according to a second embodiment.

Next, a second embodiment will be described. The second embodiment relates to a semiconductor package 20 that includes a substrate with built-in component 10 and a semiconductor chip 71. FIG. 27 is a cross-sectional view illustrating the semiconductor package 20 according to the second embodiment.

As illustrated in FIG. 27, the semiconductor package 20 according to the second embodiment includes the substrate with built-in component 10 and the semiconductor chip 71 mounted on the substrate with built-in component 10. The semiconductor chip 71 has electrode pads 72 and bumps 73, and the electrode pads 72 are connected to external connection terminals 42 via the bumps 73. Also, an underfill resin 74 is filled between the substrate with built-in component 10 and the semiconductor chip 71.

In order to manufacture such a semiconductor package 20, for example, the semiconductor chip 71 is arranged on the substrate with built-in component 10 such that the external connection terminals 42 of the substrate with built-in component 10 and the electrode pads 72 and the bumps 73 of the semiconductor chip 71 are at corresponding positions. The solder constituting the external connection terminals 42 (solder balls) and the solder constituting the bumps 73 are then melted by heating to approximately 230° C., for example, to electrically and mechanically connect the first pads 29 of the substrate with built-in component 10 with the electrode pads 72 of the semiconductor chip 71. The underfill resin 74 is then filled between the substrate with built-in component 10 and the semiconductor chip 71.

Modified Example

Next, various modified examples will be described.

Figure 28:
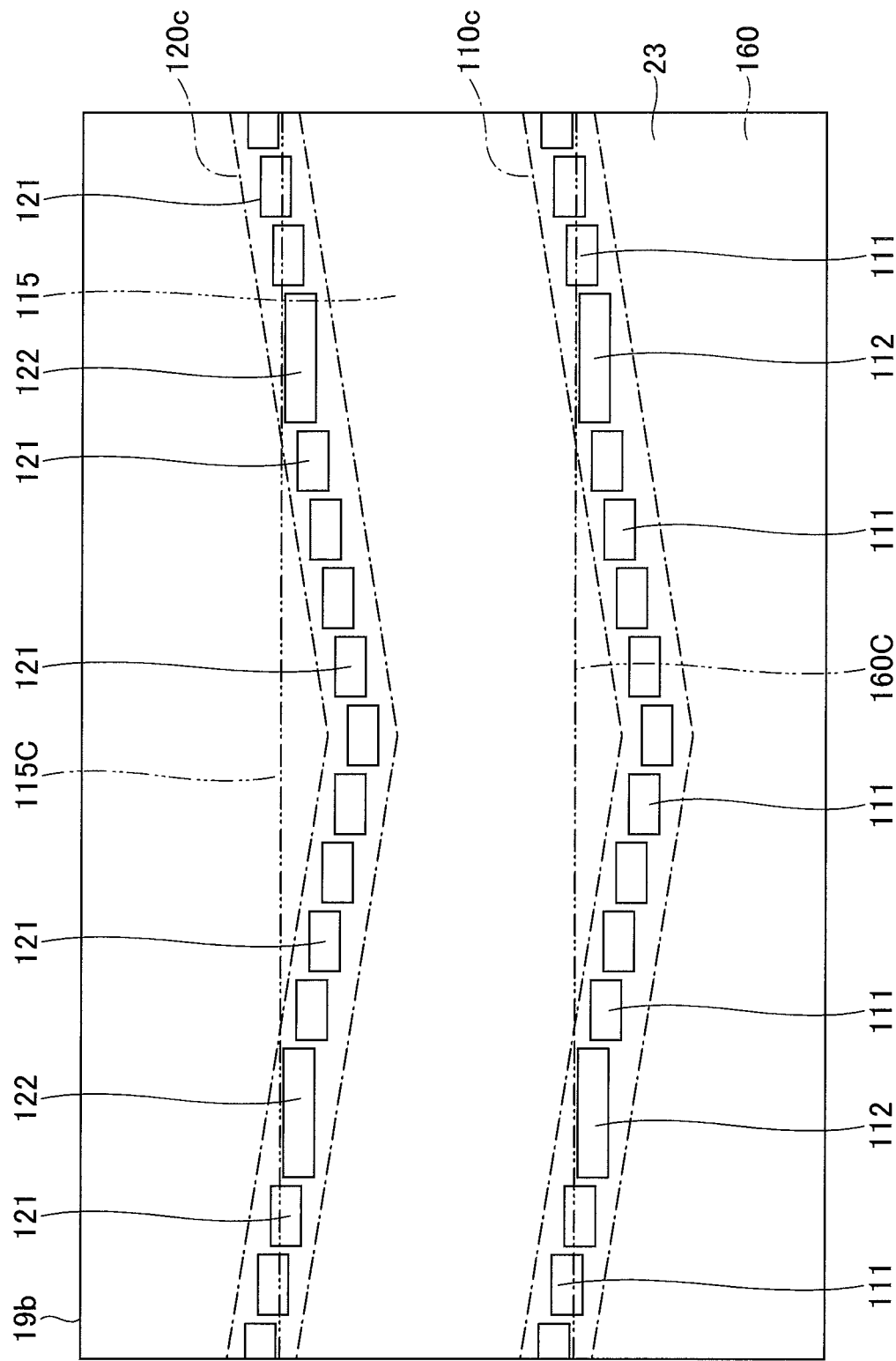
FIG. 28 is a diagram illustrating a modified example of slits.

FIG. 28 is a diagram illustrating a modified example of slits. In the modified example illustrated in FIG. 28, a reference pattern 110c includes slits 112 in addition to slits 111. The planar shape of each slit 112 is a rectangle of which to sides parallel to the side 160C have a length of 20 μm and two sides perpendicular to the side 160C have a length of 5 μm. That is, the slits 112 are longer than the slits 111 in the direction parallel to the side 160C. The plurality of slits 112 are arranged such that the number of slits 111 interposed therebetween is constant. For example, nine slits 111 are interposed between slits 112 next to each other. Four slits 111 may be interposed between slits 112 next to each other.

Similarly, a reference pattern 120c includes slits 122 in addition to slits 121. The planar shape of each slit 122 is a rectangle of which to sides parallel to the side 115C have a length of 20 μm and two sides perpendicular to the side 115C have a length of 5 μm. That is, the slits 122 are longer than the slits 121 in the direction parallel to the side 115C. The plurality of slits 122 are arranged such that the number of slits 121 interposed therebetween is constant. For example, nine slits 121 are interposed between slits 122 next to each other. Four slits 121 may be interposed between slits 122 next to each other.

Similarly, other reference patterns 110a, 110b, 110d, 120a, 120b, and 120d also include slits 112 or 122.

According to the modified example, it is more easy to specify which slits 111 or 112 are traversed by electronic component 60, and it is more easy to specify which slits 121 or 122 are traversed by the opening pattern 25x.

Figure 29:
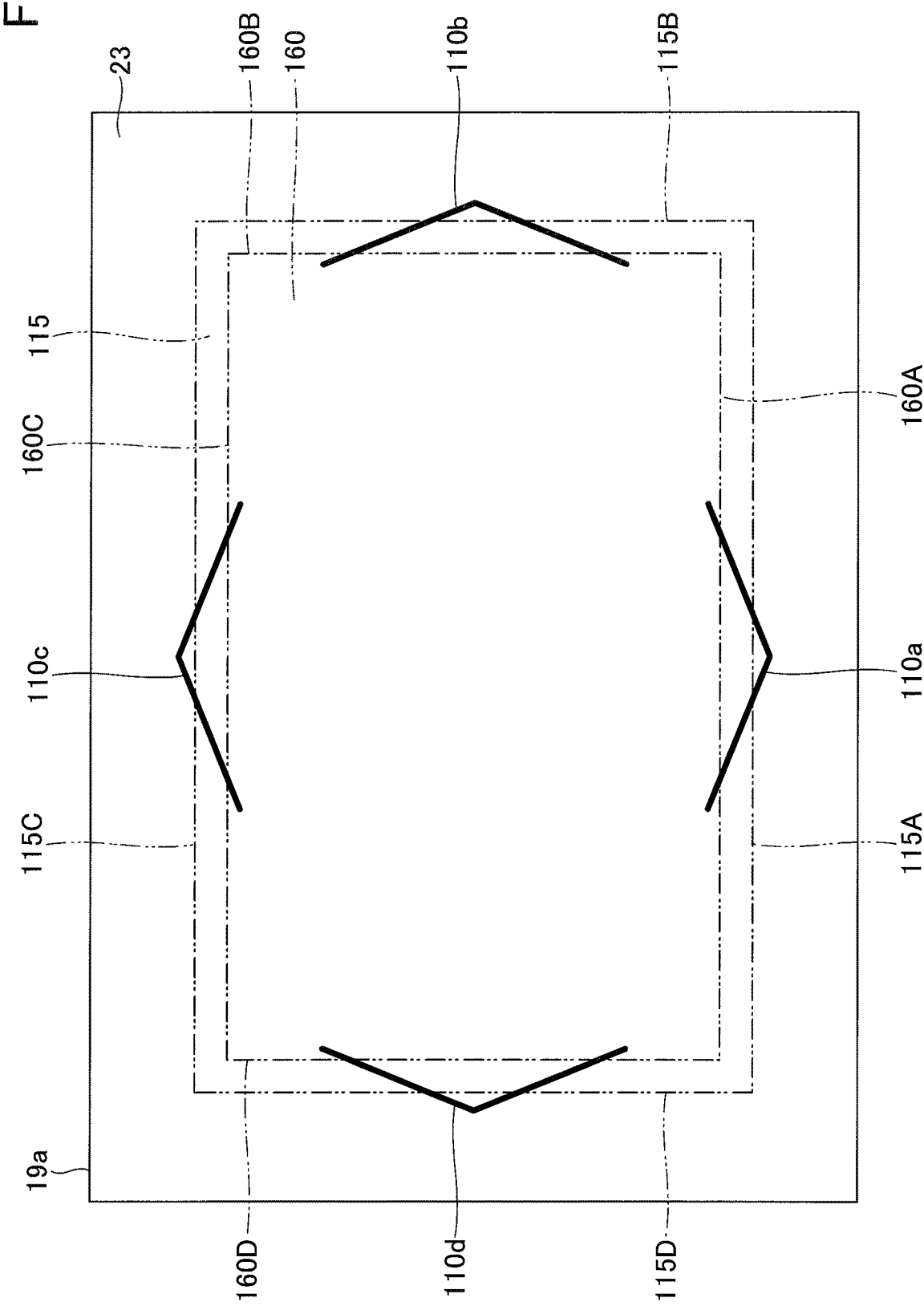
FIG. 29 is a diagram illustrating a first modified example of the arrangement of reference patterns.

FIG. 29 is a diagram illustrating a first modified example of the arrangement of reference patterns. In the modified example illustrated in FIG. 29, a reference pattern 110a is formed to traverse sides 115A and 160A, a reference pattern 110b is formed to traverse sides 115B and 160B, a reference pattern 110c is formed to traverse sides 115C and 160C, and a reference pattern 110d is formed to traverse sides 115D and 160D. On the other hand, reference patterns corresponding to the reference patterns 120a, 120b, 120c, and 120d in the first embodiment are not formed.

According to such a modified example, it is also possible to easily check the positional accuracy of the cavity 15 and the electronic component 60.

As illustrated in FIG. 29, the reference patterns 110a, 110b, 110c and 110d may bend in the shape of V outside the cavity forming area 115.

Figure 30:
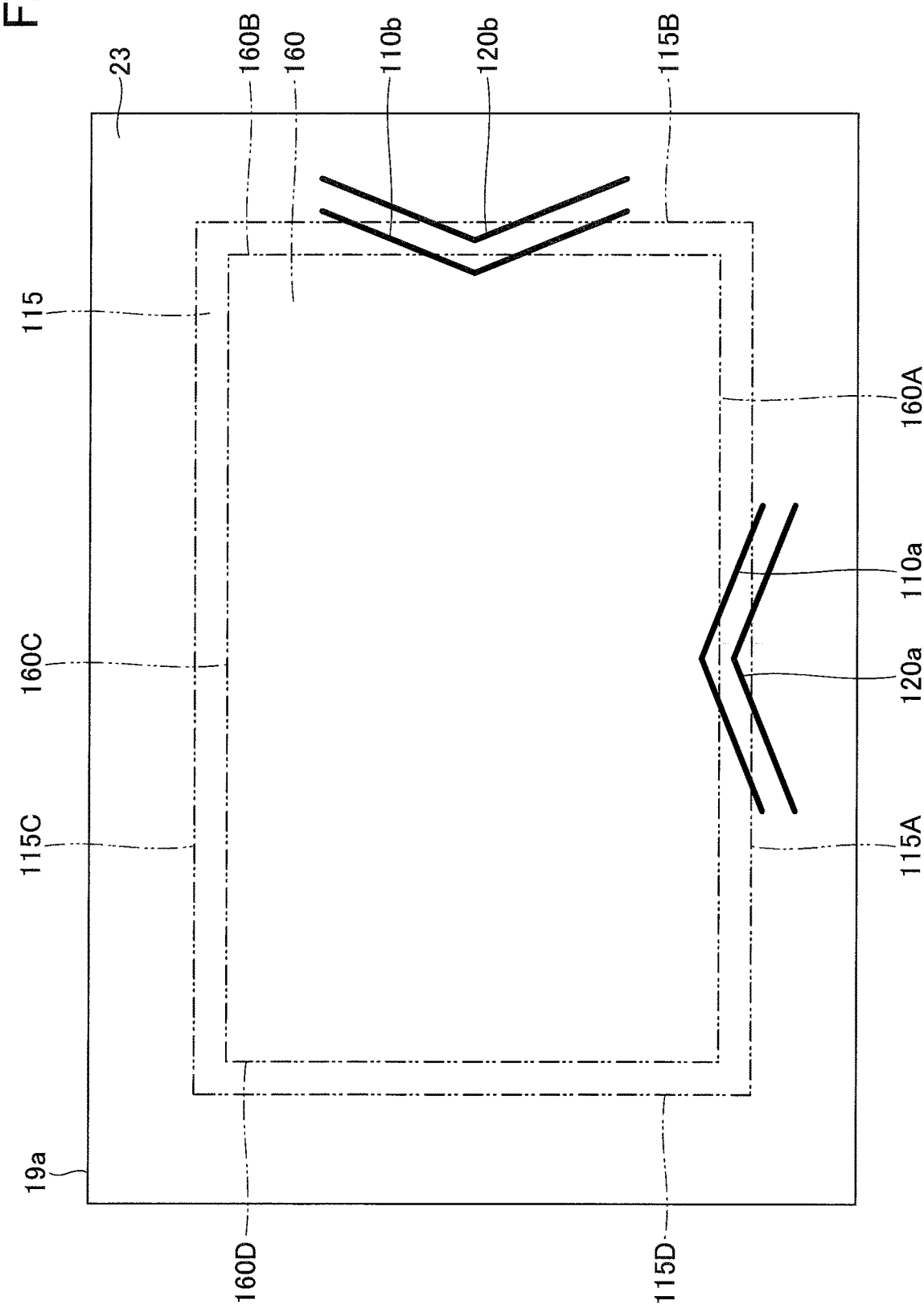
FIG. 30 is a diagram illustrating a second modified example of the arrangement of reference patterns.

FIG. 30 is a diagram illustrating a second modified example of the arrangement of reference patterns. In the modified example illustrated in FIG. 30, the reference patterns 110a, 110b, 120a, and 120b are formed, but reference patterns corresponding to the reference patterns 110c, 110d, 120c, and 120d according to the first embodiment are not formed.

According to such a modified example, it is also possible to easily check the positional accuracy of the cavity 15 and the electronic component 60. That is, when reference patterns are provided to correspond to two side surfaces of the electronic component 60 that cross with each other at an angle greater than 0 degrees, the positional accuracy of the cavity 15 and the electronic component 60 in the direction parallel to the one surface of the wiring layer 23 can be easily checked.

Various aspects of the subject-matter described herein may be set out non-exhaustively in the following numbered clauses:

1. A method of manufacturing a substrate with built-in component, the method comprising:
   a step of forming a first wiring layer having at least one reference pattern;
   a step of forming a first insulating layer on the first wiring layer; and
   a step of forming a cavity in the first insulating layer; and
   a step of mounting an electronic component in the cavity and on the first wiring layer;
   wherein the at least one reference pattern includes
   at least one first portion crossing a side surface of the electronic component in plan view, and
   at least one second portion crossing a side surface of the cavity in plan view.

2. The method of manufacturing a substrate with built-in component according to clause 1, further comprising: after the step of mounting the electronic component, a step of checking positional accuracy between the electronic component and the cavity based on the reference pattern at a portion of the first portion and the second portion exposed in the cavity.

3. The method of manufacturing a substrate with built-in component according to clause 1 or clause 2, further comprising, between the step of forming the first insulating layer and the step of forming the cavity,
   a step of forming a second wiring layer on the first insulating layer; and
   a step of forming a second insulating layer on the second wiring layer,
   wherein the cavity is formed so as to be connected to the second wiring layer and the second insulating layer, and
   wherein an upper surface of at least a portion of the second wiring layer is exposed from the second insulating layer in the cavity.

4. The method of manufacturing a substrate with built-in component according to any one of clauses 1 to 3, wherein the at least one reference pattern has, as a scale, and the method includes a step of forming, as the scale, a plurality of slits penetrating the first wiring layer.

5. The method of manufacturing a substrate with built-in component according to clause 4, further comprising: a step of arranging the plurality of slits at regular intervals in a direction inclined from a direction parallel to the side surface of the electronic component in plan view.

Although preferable embodiments and the like have been described above in detail, the present disclosure is not limited to the preferable embodiments and the like described above, and various modifications and substitutions may be made for the preferable embodiments and the like described above without departing from the scope of claims.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A substrate with built-in component comprising:
   a first wiring layer having at least one reference pattern;
   a first insulating layer formed on the first wiring layer; and
   an electronic component mounted, in a cavity formed in the first insulating layer, on the first wiring layer,
   wherein the at least one reference pattern includes
   at least one first portion crossing a side surface of the electronic component in plan view, and
   at least one second portion crossing a side surface of the cavity in plan view,
   wherein the at least one reference pattern has, as a scale, a plurality of slits penetrating the first wiring layer and
   the plurality of slits are arranged at regular intervals in a direction inclined from a direction parallel to the side surface of the electronic component in plan view.

2. The substrate with built-in component according to claim 1, further comprising:
   a second wiring layer formed on the first insulating layer; and
   a second insulating layer formed on the second wiring layer,
   wherein the cavity is formed so as to be connected to the second wiring layer and the second insulating layer, and
   wherein an upper surface of at least a portion of the second wiring layer is exposed from the second insulating layer in the cavity.

3. The substrate with built-in component according to claim 2, wherein the second wiring layer has an opening pattern with two side surfaces crossing each other at an angle greater than 0 degrees at a portion where the upper surface is exposed from the second insulating layer.

4. The substrate with built-in component according to claim 1,
   wherein the electronic component has a polygonal planar shape, and
   wherein the at least one reference pattern includes a plurality of patterns corresponding to at least two sides of the polygonal shape.

5. The substrate with built-in component according to claim 1, wherein the at least one first portion includes a plurality of first portions and the at least one second portion includes a plurality of second portions.

6. The substrate with built-in component according to claim 1, wherein the plurality of slits include
   a plurality of first slits having a first planar shape; and
   a plurality of second slits having a second planar shape different from the first planar shape; and
   wherein the second slits are provided for each group of a constant number of the first slits.

* * * * *